US010418980B2

(12) United States Patent
Kurokawa

(10) Patent No.: US 10,418,980 B2
(45) Date of Patent: Sep. 17, 2019

(54) SEMICONDUCTOR DEVICE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/152,451

(22) Filed: Oct. 5, 2018

(65) Prior Publication Data

US 2019/0052250 A1    Feb. 14, 2019

Related U.S. Application Data

(63) Continuation of application No. 15/652,316, filed on Jul. 18, 2017, now Pat. No. 10,097,167.

(30) Foreign Application Priority Data

Jul. 19, 2016   (JP) .................................. 2016-141337

(51) Int. Cl.
*H03K 3/356* (2006.01)
*H03K 3/037* (2006.01)
(Continued)

(52) U.S. Cl.
CPC ....... *H03K 3/356104* (2013.01); *H03K 3/012* (2013.01); *H03K 3/037* (2013.01); *H03K 19/0013* (2013.01); *H03K 19/20* (2013.01)

(58) Field of Classification Search
CPC .. H03K 3/037; H03K 3/356104; H03K 19/20; H03K 19/23
(Continued)

(56) References Cited

U.S. PATENT DOCUMENTS 4,785,204 A * 11/1988 Terada ................. H03K 19/215
                                                                326/104
5,640,105 A *  6/1997 Sobelman ................. G06F 5/08
                                                                326/121
(Continued)

FOREIGN PATENT DOCUMENTS

CN        102804360 A      11/2012
CN        104769842 A       7/2015
(Continued)

OTHER PUBLICATIONS

International Search Report (Application No. PCT/IB2017/054061) dated Sep. 19, 2017.
(Continued)

*Primary Examiner* — Jason Crawford
(74) *Attorney, Agent, or Firm* — Fish & Richardson P.C.

(57) ABSTRACT

To provide an asynchronous circuit capable of power gating, a semiconductor device is configured with first to third terminals, a latch circuit, and a memory circuit. The third terminal outputs "false" when "false" is input to the first terminal and the second terminal. The third terminal outputs "true" when "true" is input to the first terminal and the second terminal. The third terminal outputs a truth value that is the same as the previous output, when "true" is input to one of the first terminal and the second terminal and "false" is input to the other of the first terminal and the second terminal. The memory circuit is capable of storing data stored in the latch circuit, while supply of a power supply voltage is stopped. The memory circuit includes a transistor that contains a metal oxide in a channel formation region.

4 Claims, 22 Drawing Sheets

(51) Int. Cl.
*H03K 19/00* (2006.01)
*H03K 19/20* (2006.01)
*H03K 3/012* (2006.01)

(58) Field of Classification Search
USPC ............ 326/11, 35, 104, 112, 114, 119, 121
See application file for complete search history.

(56) References Cited

U.S. PATENT DOCUMENTS

| | | | | |
|---|---|---|---|---|
| 5,918,042 | A * | 6/1999 | Furber | G06F 9/3871 |
| | | | | 708/233 |
| 6,262,593 | B1 * | 7/2001 | Sobelman | H03K 19/0813 |
| | | | | 326/119 |
| 6,281,707 | B1 * | 8/2001 | Fairbanks | G06F 9/3869 |
| | | | | 326/58 |
| 6,486,700 | B1 * | 11/2002 | Fairbanks | G06F 9/3869 |
| | | | | 326/35 |
| 6,654,944 | B1 * | 11/2003 | Dike | H03K 19/20 |
| | | | | 326/38 |
| 6,900,658 | B1 * | 5/2005 | Sobelman | G06F 7/502 |
| | | | | 326/121 |
| 7,330,054 | B1 * | 2/2008 | Masleid | H03K 5/1252 |
| | | | | 326/121 |
| 7,451,384 | B2 * | 11/2008 | Erstad | H03K 19/00392 |
| | | | | 326/35 |
| 7,554,374 | B2 * | 6/2009 | Fairbanks | H03K 5/1565 |
| | | | | 327/175 |
| 7,635,989 | B1 * | 12/2009 | Young | G06F 15/7867 |
| | | | | 326/39 |
| 7,710,159 | B2 * | 5/2010 | Shinde | H03K 19/01707 |
| | | | | 326/115 |
| 8,455,868 | B2 | 6/2013 | Yamazaki et al. | |
| 9,064,574 | B2 | 6/2015 | Aoki et al. | |
| 9,111,051 | B2 | 8/2015 | Hanyu et al. | |
| 9,349,735 | B2 | 5/2016 | Yamazaki et al. | |
| 9,490,789 | B1 * | 11/2016 | Tian | H03K 5/135 |
| 10,097,167 | B2 * | 10/2018 | Kurokawa | H03K 3/037 |
| 2002/0017924 | A1 * | 2/2002 | Knowles | H03K 19/00338 |
| | | | | 326/119 |
| 2004/0130349 | A1 * | 7/2004 | Morgenshtein | G06F 17/505 |
| | | | | 326/112 |
| 2004/0257108 | A1 * | 12/2004 | Carlson | H03K 19/00338 |
| | | | | 326/14 |
| 2007/0016823 | A1 * | 1/2007 | Jang | H03K 19/0075 |
| | | | | 714/6.12 |
| 2010/0097131 | A1 * | 4/2010 | Bainbridge | H03K 5/1252 |
| | | | | 327/551 |
| 2010/0231263 | A1 * | 9/2010 | Fish | H03K 19/0948 |
| | | | | 326/121 |
| 2011/0156027 | A1 | 6/2011 | Yamazaki et al. | |
| 2011/0291696 | A1 * | 12/2011 | Clerc | H03K 19/23 |
| | | | | 326/8 |
| 2012/0274356 | A1 | 11/2012 | Takahashi | |
| 2012/0294102 | A1 | 11/2012 | Ishizu | |
| 2013/0134416 | A1 | 5/2013 | Nishijima et al. | |
| 2013/0191673 | A1 | 7/2013 | Koyama et al. | |
| 2013/0235689 | A1 | 9/2013 | Koyama | |
| 2013/0262828 | A1 | 10/2013 | Yoneda | |
| 2013/0262896 | A1 | 10/2013 | Yoneda | |
| 2013/0270551 | A1 | 10/2013 | Yoneda | |
| 2013/0285711 | A1 | 10/2013 | Miyake | |
| 2013/0293266 | A1 | 11/2013 | Takemura | |
| 2013/0297874 | A1 | 11/2013 | Kurokawa | |
| 2013/0297952 | A1 | 11/2013 | Miyake | |
| 2013/0315011 | A1 | 11/2013 | Takahashi et al. | |
| 2013/0315021 | A1 | 11/2013 | Kondo et al. | |
| 2013/0326244 | A1 | 12/2013 | Koyama et al. | |
| 2014/0015564 | A1 * | 1/2014 | Cannon | H03K 19/20 |
| | | | | 326/13 |
| 2014/0025978 | A1 | 1/2014 | Tokunaga | |
| 2014/0068300 | A1 | 3/2014 | Nishijima et al. | |
| 2014/0108836 | A1 | 4/2014 | Nishijima et al. | |
| 2014/0126271 | A1 | 5/2014 | Aoki et al. | |
| 2014/0159771 | A1 | 6/2014 | Ikeda et al. | |
| 2014/0208142 | A1 | 7/2014 | Tamura | |
| 2014/0325171 | A1 | 10/2014 | Yoneda | |
| 2014/0340127 | A1 | 11/2014 | Kobayashi et al. | |
| 2014/0340134 | A1 | 11/2014 | Shionoiri | |
| 2014/0368235 | A1 | 12/2014 | Aoki et al. | |
| 2015/0103611 | A1 | 4/2015 | Ishizu | |
| 2015/0117093 | A1 | 4/2015 | Onuki et al. | |
| 2015/0269977 | A1 | 9/2015 | Ishizu et al. | |
| 2015/0370313 | A1 | 12/2015 | Tamura | |
| 2016/0006433 | A1 | 1/2016 | Ishizu et al. | |
| 2016/0043716 | A1 | 2/2016 | Kurokawa et al. | |
| 2016/0071587 | A1 * | 3/2016 | Di Pendina | G11C 11/1675 |
| | | | | 365/158 |
| 2016/0217848 | A1 | 7/2016 | Ishizu et al. | |
| 2016/0226490 | A1 | 8/2016 | Kozuma et al. | |
| 2016/0232956 | A1 | 8/2016 | Ishizu et al. | |
| 2016/0233866 | A1 | 8/2016 | Ishizu et al. | |
| 2016/0260718 | A1 | 9/2016 | Yamazaki et al. | |
| 2016/0301932 | A1 | 10/2016 | Kurokawa | |
| 2016/0379564 | A1 | 12/2016 | Inoue et al. | |
| 2017/0187357 | A1 | 6/2017 | Tamura | |
| 2017/0248128 | A1 | 8/2017 | Koyama et al. | |

FOREIGN PATENT DOCUMENTS

| | | |
|---|---|---|
| JP | 2002-124866 A | 4/2002 |
| JP | 2011-151383 A | 8/2011 |
| JP | 2013-008437 A | 1/2013 |
| JP | 2014-112827 A | 6/2014 |
| KR | 2012-0094146 A | 8/2012 |
| KR | 2015-0082408 A | 7/2015 |
| WO | WO-2011/077967 | 6/2011 |
| WO | WO-2011/149066 | 12/2011 |
| WO | WO-2014/073374 | 5/2014 |

OTHER PUBLICATIONS

Written Opinion (Application No. PCT/IB2017/054061) dated Sep. 19, 2017.

* cited by examiner

FIG. 2A
10
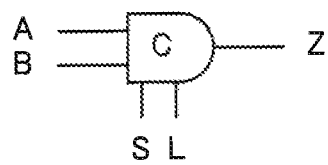
FIG. 2B
| A | B | Z |
|---|---|---|
| 0 | 0 | 0 |
| 1 | 1 | 1 |
| 0 | 1 | Z' |
| 1 | 0 | Z' |
FIG. 2C
13
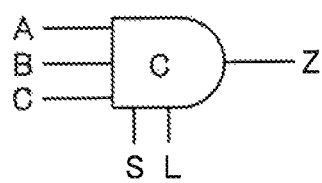
FIG. 2D
| A | B | C | Z |
|---|---|---|---|
| 0 | 0 | 0 | 0 |
| 1 | 0 | 0 | Z' |
| 0 | 1 | 0 | Z' |
| 1 | 1 | 0 | Z' |
| 0 | 0 | 1 | Z' |
| 1 | 0 | 1 | Z' |
| 0 | 1 | 1 | Z' |
| 1 | 1 | 1 | 1 |

20

26

FIG. 22A
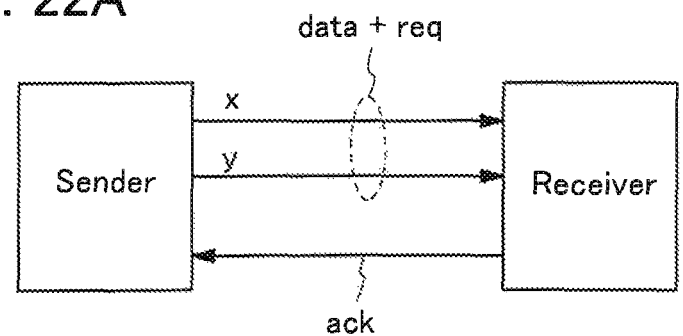
FIG. 22B
| | (x, y) |
|---|---|
| spacer | (0, 0) |
| "0" | (1, 0) |
| "1" | (0, 1) |
| inhibit | (1, 1) |
FIG. 22C
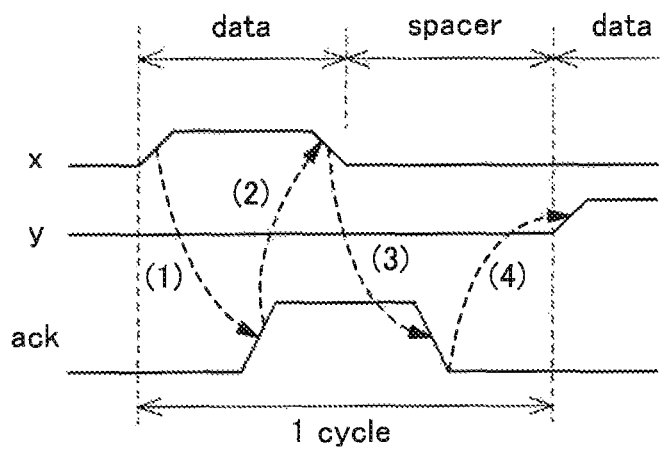

SEMICONDUCTOR DEVICE

CROSS-REFERENCE TO RELATED APPLICATIONS

This application is a continuation of U.S. application Ser. No. 15/652,316, filed Jul. 18, 2017, now allowed, which claims the benefit of a foreign priority application filed in Japan as Serial No. 2016-141337 on Jul. 19, 2016, both of which are incorporated by reference.

TECHNICAL FIELD

One embodiment of the present invention relates to a semiconductor device.

One embodiment of the present invention relates to a display device including the semiconductor device. Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. In some cases, a display device, a light-emitting device, a memory device, an electro-optical device, a semiconductor circuit, or an electronic device includes a semiconductor device.

BACKGROUND ART

LSI mainly employs synchronous circuits, in which data in flip-flops is updated in synchronization with the rising edge or the falling edge of a clock signal. Synchronous circuits have an advantage such as the ease of designing, but have a disadvantage of instantaneous increase in power consumption because circuits operate simultaneously in synchronization with a clock signal. Synchronous circuits also have a disadvantage in that the cost for layout design is increased because a clock signal needs to be distributed among components of the circuits without delay.

To eliminate the above disadvantages of synchronous circuits, asynchronous circuits are employed, in which data is transmitted and received between circuit portions without using a clock signal by a method called "handshake." As a communication protocol for asynchronous circuits, a four-phase dual-rail protocol is known, in which dual-rail encoding and four-phase encoding are used in combination (see Patent Document 1).

The four-phase dual-rail protocol will be described with reference to FIGS. 22A to 22C.

FIG. 22A is a block diagram showing the concept of the four-phase dual-rail protocol. As shown in FIG. 22A, data is communicated by two signal lines x and y. A sender sends data to a receiver. In response to a request (req) from the sender, the receiver sends back an acknowledgement signal (ack) to the sender to signify the receipt of the data.

FIG. 22B shows a truth table of the four-phase dual-rail protocol. In dual-rail encoding, 1-bit data is expressed using two signal lines. A state where (x, y)=(1, 0) means that data is "0." A state where (x, y)=(0, 1) means that data is "1." A state where (x, y)=(0, 0) is called "spacer" that is used to delimit consecutive data. A state where (x, y)=(1, 1) is called "inhibit" that is an invalid value which a circuit cannot have according to the operating principle.

FIG. 22C is a timing chart showing a communication procedure for the four-phase dual-rail protocol. In the four-phase dual-rail protocol, data ("0" or "1") and a spacer are alternately exchanged. First, the sender identifies an acknowledgement signal from the receiver and sends data to the receiver (1). In FIG. 22C, data "0" is sent as an example. Next, the receiver detects the data and sends an acknowledgement signal to the sender (2). Then, the sender identifies the acknowledgement signal and sends a spacer to the receiver (3). The receiver detects the spacer and sends an acknowledgement signal to the sender (4). In such a manner, the four-phase dual-rail protocol requires four steps to complete one data transfer.

A transistor using an oxide semiconductor or a metal oxide in its channel formation region (an oxide semiconductor transistor, hereinafter referred to as OS transistor) exhibits an extremely low off-state current. Patent Document 2 discloses a flip-flop capable of storing a logic state even while power supply is stopped, by using an OS transistor with the extremely low off-state current.

PATENT DOCUMENT

Patent Document 1: PCT International Publication No. 2011/149066

Patent Document 2: Japanese Published Patent Application No. 2013-008437

DISCLOSURE OF INVENTION

An object of one embodiment of the present invention is to provide an asynchronous circuit capable of power gating. Another object of one embodiment of the present invention is to provide a semiconductor device with low power consumption. Another object of one embodiment of the present invention is to provide a novel semiconductor device.

Note that the description of a plurality of objects does not preclude the existence of each object. One embodiment of the present invention does not necessarily achieve all the objects listed above. Objects other than those listed above are apparent from the description of the specification, the drawings, the claims, and the like, and such objects can be an object of one embodiment of the present invention.

One embodiment of the present invention is a semiconductor device including first to third terminals, a latch circuit, and a memory circuit. The third terminal outputs "false" when "false" is input to the first terminal and the second terminal. The third terminal outputs "true" when "true" is input to the first terminal and the second terminal. The third terminal outputs a truth value that is the same as the previous output, when "true" is input to one of the first terminal and the second terminal and "false" is input to the other of the first terminal and the second terminal. The memory circuit is capable of storing data stored in the latch circuit, while supply of a power supply voltage is stopped.

One embodiment of the present invention is a semiconductor device including first to fourth transistors, a latch circuit, and a memory circuit. The first transistor is an n-channel transistor. The second transistor is an n-channel transistor. The third transistor is a p-channel transistor. The fourth transistor is a p-channel transistor. One of a source and a drain of the first transistor is supplied with a low power supply voltage. The other of the source and the drain of the first transistor is electrically connected to one of a source and a drain of the second transistor. The other of the source and the drain of the second transistor is electrically connected to one of a source and a drain of the third transistor. The other of the source and the drain of the third transistor is electrically connected to one of a source and a drain of the fourth transistor. The other of the source and the drain of the fourth transistor is supplied with a high power supply voltage. A gate of the first transistor is electrically connected to a gate of the fourth transistor. A gate of the second transistor is electrically connected to a gate of the third transistor. The latch circuit is electrically connected to the one of the source and the drain of the third transistor. The memory circuit is capable of storing data stored in the latch circuit, while supply of a power supply voltage is stopped.

In either of the above embodiments, the memory circuit preferably includes a transistor that contains a metal oxide in its channel formation region.

One embodiment of the present invention is a buffer circuit including the semiconductor device according to any of the above embodiments.

One embodiment of the present invention is a NOT circuit including the semiconductor device according to any of the above embodiments.

One embodiment of the present invention is a semiconductor device including first to fourth terminals, a latch circuit, and a memory circuit. The fourth terminal outputs "false" when "false" is input to the first terminal, the second terminal, and the third terminal. The fourth terminal outputs "true" when "true" is input to the first terminal, the second terminal, and the third terminal. The fourth terminal outputs a truth value that is the same as the previous output, when "true" is input to at least one of the first terminal, the second terminal, and the third terminal and "false" is input to at least another one of the first terminal, the second terminal, and the third terminal. The memory circuit is capable of storing data stored in the latch circuit, while supply of a power supply voltage is stopped.

One embodiment of the present invention is a semiconductor device including first to sixth transistors, a latch circuit, and a memory circuit. The first transistor is an n-channel transistor. The second transistor is an n-channel transistor. The third transistor is an n-channel transistor. The fourth transistor is a p-channel transistor. The fifth transistor is a p-channel transistor. The sixth transistor is a p-channel transistor. One of a source and a drain of the first transistor is supplied with a low power supply voltage. The other of the source and the drain of the first transistor is electrically connected to one of a source and a drain of the second transistor. The other of the source and the drain of the second transistor is electrically connected to one of a source and a drain of the third transistor. The other of the source and the drain of the third transistor is electrically connected to one of a source and a drain of the fourth transistor. The other of the source and the drain of the fourth transistor is electrically connected to one of a source and a drain of the fifth transistor. The other of the source and the drain of the fifth transistor is electrically connected to one of a source and a drain of the sixth transistor. The other of the source and the drain of the sixth transistor is supplied with a high power supply voltage. A gate of the first transistor is electrically connected to a gate of the sixth transistor. A gate of the second transistor is electrically connected to a gate of the fifth transistor. A gate of the third transistor is electrically connected to a gate of the fourth transistor. The latch circuit is electrically connected to the one of the source and the drain of the fourth transistor. The memory circuit is capable of storing data stored in the latch circuit, while supply of a power supply voltage is stopped.

In either of the above embodiments, the memory circuit preferably includes a transistor that contains a metal oxide in its channel formation region.

One embodiment of the present invention is an AND circuit including the semiconductor device according to any of the above embodiments.

One embodiment of the present invention is a NAND circuit including the semiconductor device according to any of the above embodiments.

One embodiment of the present invention is an OR circuit including the semiconductor device according to any of the above embodiments.

One embodiment of the present invention is a NOR circuit including the semiconductor device according to any of the above embodiments.

One embodiment of the present invention can provide an asynchronous circuit capable of power gating. One embodiment of the present invention can provide a semiconductor device with low power consumption. One embodiment of the present invention can provide a novel semiconductor device.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 2A to 2D show symbols representing semiconductor devices and truth tables of the semiconductor devices;

FIGS. 22A to 22C are diagrams for explaining the four-phase dual-rail protocol.

BEST MODE FOR CARRYING OUT THE INVENTION

Figure 1A:
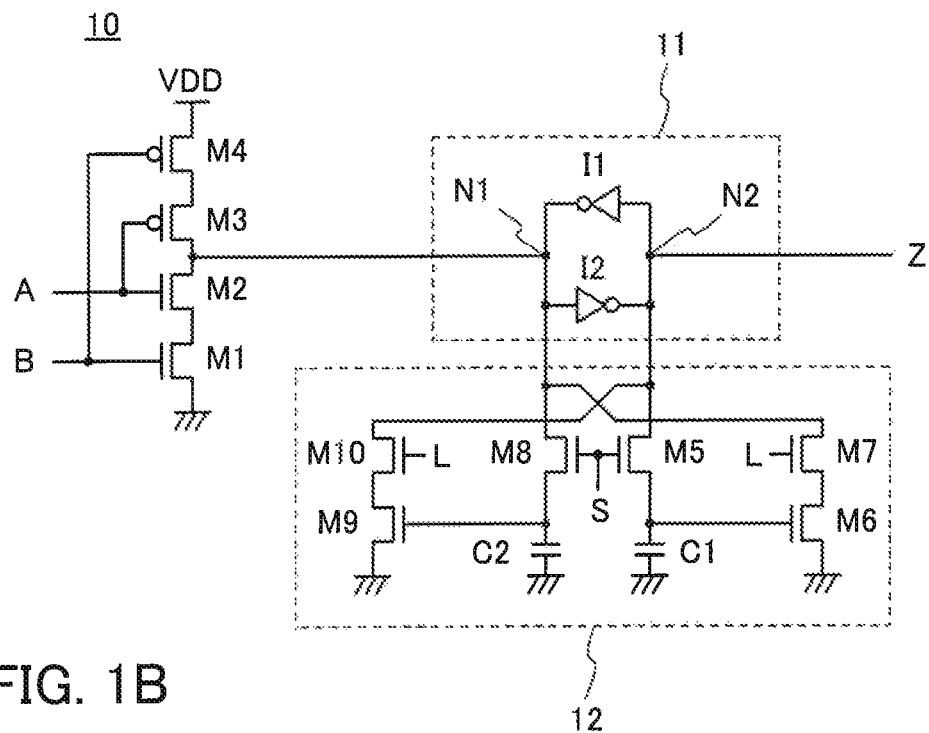
FIGS. 1A and 1B are circuit diagrams each illustrating a configuration example of a semiconductor device.

Embodiments will be hereinafter described with reference to drawings. Note that the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that drawings are schematic views showing ideal examples, and embodiments of the present invention are not limited to shapes or values shown in the drawings.

In this specification, a high power supply voltage is referred to as H level and a low power supply voltage is referred to as L level in some cases. In addition, a wiring through which the H level is supplied is referred to as VDD and a wiring through which the L level is supplied is referred to as GND in some cases.

In this specification, any of the embodiments described below can be combined as appropriate. In addition, when a plurality of structure examples are described in one embodiment, some of the structure examples can be combined as appropriate.

Embodiment 1

This embodiment will explain a semiconductor device that is one embodiment of the present invention and is capable of functioning as an asynchronous circuit.
<Basic Circuits>

First, a semiconductor device functioning as a basic circuit of an asynchronous circuit will be described.

FIG. 1A is a circuit diagram of a semiconductor device 10. The semiconductor device 10 includes transistors M1 to M10, a capacitor C1, a capacitor C2, an inverter I1, and an inverter I2. In the drawing, a circuit portion including the transistors M5 to M10, the capacitor C1, and the capacitor C2 is referred to as a memory circuit 12.

Among the transistors M1 to M10, the transistors M3 and M4 are p-channel transistors and the other transistors are n-channel transistors in the following description.

A node of an output terminal of the inverter I1 and an input terminal of the inverter I2 is referred to as a node N1. Anode of an input terminal of the inverter I1 and an output terminal of the inverter I2 is referred to as a node N2. The inverter I1 and the inverter I2 constitute a latch circuit 11. A signal Z is output from the node N2.

One of a source and a drain of the transistor M1 is electrically connected to GND. The other of the source and the drain the transistor M1 is electrically connected to one of a source and a drain of the transistor M2. The other of the source and the drain the transistor M2 is electrically connected to one of a source and a drain of the transistor M3. The other of the source and the drain the transistor M3 is electrically connected to one of a source and a drain of the transistor M4. The other of the source and the drain the transistor M4 is electrically connected to VDD.

A gate of the transistor M2 and a gate of the transistor M3 are electrically connected to each other and are supplied with a signal A. A gate of the transistor M1 and a gate of the transistor M4 are electrically connected to each other and are supplied with a signal B. The one of the source and the drain the transistor M3 is electrically connected to the node N1.

A first terminal of the capacitor C1 is electrically connected to GND. A second terminal of the capacitor C1 is electrically connected to one of a source and a drain of the transistor M5. The other of the source and the drain of the transistor M5 is electrically connected to the node N2. A gate of the transistor M5 is supplied with a signal S.

One of a source and a drain of the transistor M6 is electrically connected to GND. The other of the source and the drain the transistor M6 is electrically connected to one of a source and a drain of the transistor M7. The other of the source and the drain the transistor M7 is electrically connected to the node N1. A gate of the transistor M6 is electrically connected to the second terminal of the capacitor C1. A gate of the transistor M7 is supplied with a signal L.

A first terminal of the capacitor C2 is electrically connected to GND. A second terminal of the capacitor C2 is electrically connected to one of a source and a drain of the transistor M8. The other of the source and the drain of the transistor M8 is electrically connected to the node N1. A gate of the transistor M8 is supplied with the signal S.

One of a source and a drain of the transistor M9 is electrically connected to GND. The other of the source and the drain the transistor M9 is electrically connected to one of a source and a drain of the transistor M10. The other of the source and the drain the transistor M10 is electrically connected to the node N2. A gate of the transistor M9 is electrically connected to the second terminal of the capacitor C2. A gate of the transistor M10 is supplied with the signal L.

The semiconductor device 10 outputs Z=0 when (A, B)=(0, 0), outputs Z=1 when (A, B)=(1, 1), and holds the previous value as Z when (A, B)=(0, 1) or (1, 0).

The latch circuit 11 has a function of storing 1-bit data. The node N1 and the node N2 have functions of holding signals that are inverted from each other.

The memory circuit 12 has a function of storing data held in the latch circuit 11 (the node N1 and the node N2). In the semiconductor device 10, when S=1 is set, a potential corresponding to data held in the latch circuit 11 (the node N1 and the node N2) is stored in the capacitors C1 and C2. When L=1 is set, data corresponding to the potential stored in the capacitors C1 and C2, i.e., the data that is originally held in the latch circuit 11 can be returned to the latch circuit 11.

The transistors M5 and M8 are preferably OS transistors, in which case the off-state current of the transistors M5 and M8 can be extremely low. Accordingly, data stored in the capacitor C1 can be held for a long time by turning off the transistor M5, and data stored in the capacitor C2 can be held for a long time by turning off the transistor M8, for example. In other words, the memory circuit 12 functions as a nonvolatile register.

The transistors M5 to M10 may be OS transistors, in which case the memory circuit 12 composed of the OS transistors can be stacked over the latch circuit 11 composed of Si transistors, leading to a smaller circuit area.

Alternatively, the transistors M5 and M8 may be OS transistors and the transistors M6, M7, M9, and M10 may be Si transistors. In this case, data in the memory circuit 12 can be returned to the latch circuit 11 at higher speed.

Further alternatively, the transistor M5, the transistor M8, one of the transistors M6 and M7, and one of the transistors M9 and M10 may be OS transistors and the other of the transistors M6 and M7 and the other of the transistors M9 and M10 may be Si transistors. In this case, static leakage current of the memory circuit 12 can be reduced, and data retention in the latch circuit 11 can be stable.

An OS transistor preferably contains an oxide semiconductor or a metal oxide in a channel formation region. An oxide semiconductor or a metal oxide used for an OS transistor is preferably an oxide containing at least one of indium (In) and zinc (Zn). Typical examples of such oxides include In-M-Zn oxide, In-M oxide, Zn-M oxide, and In—Zn oxide, where the element M is aluminum (Al), gallium (Ga), yttrium (Y), tin (Sn), boron (B), silicon (Si), titanium (Ti), iron (Fe), nickel (Ni), germanium (Ge), zirconium (Zr), molybdenum (Mo), lanthanum (La), cerium (Ce), neodymium (Nd), vanadium (V), beryllium (Be), hafnium (Hf), tantalum (Ta), or tungsten (W), for example. The off-state current per channel width of 1 μm of an OS transistor can be low and approximately from 1 yA/μm (y: yocto, $10^{-24}$) to 1 zA/μm (z: zepto, $10^{-21}$).

A cloud-aligned composite oxide semiconductor (CAC-OS) is preferably used for an OS transistor. Note that the details of the CAC-OS will be described later in Embodiment 3.

In the semiconductor device 10, supply of the power supply voltage may be stopped after data held in the latch circuit 11 is saved in the memory circuit 12. In this case, the memory circuit 12 serves as a nonvolatile memory and keeps storing the data even without supply of the power supply voltage. When supply of the power supply voltage resumes, the data in the memory circuit 12 is returned to the latch circuit 11.

Accordingly, the semiconductor device 10 can be powered off in a proactive manner when data is not updated, resulting in lower power consumption.

Figure 1B:
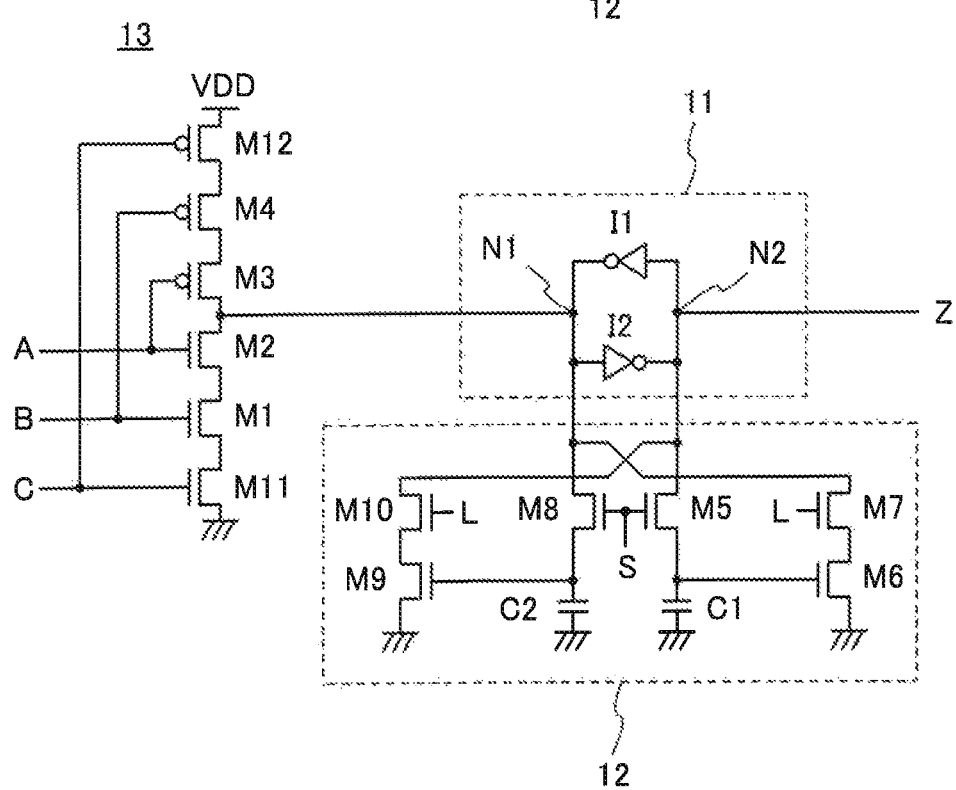

FIG. 1B is a circuit diagram of a semiconductor device 13. The semiconductor device 13 is configured such that a transistor M11 is additionally provided between the transistor M1 and GND and a transistor M12 is additionally provided between the transistor M4 and VDD in the semiconductor device 10. The transistor M11 is an n-channel transistor, and the transistor M12 is a p-channel transistor.

In the semiconductor device 13, the gate of the transistor M2 and the gate of the transistor M3 are electrically connected to each other and are supplied with the signal A. The gate of the transistor M1 and the gate of the transistor M4 are electrically connected to each other and are supplied with the signal B. A gate of the transistor M11 and a gate of the transistor M12 are electrically connected to each other and are supplied with a signal C.

FIG. 2A shows a symbol of the semiconductor device 10 in FIG. 1A. FIG. 2B shows a truth table of the semiconductor device 10. In the table, 1 represents "true," 0 represents "false," and Z' means a state of keeping the previous state.

FIG. 2C shows a symbol of the semiconductor device 13 in FIG. 1B. FIG. 2D shows a truth table of the semiconductor device 13. In the table, 1 represents "true," 0 represents "false," and Z' means a state of keeping the previous state.

It is seen from FIGS. 2B and 2D that the semiconductor devices 10 and 13 each have a function of the Muller C-element, which is frequently used in asynchronous circuits. Specifically, the semiconductor device 10 is a two-input nonvolatile Muller C-element, in which the memory circuit 12 is added to a two-input Muller C-element composed of the transistors M1 to M4 and the latch circuit 11. The semiconductor device 13 is a three-input nonvolatile Muller C-element, in which the memory circuit 12 is added to a three-input Muller C-element composed of the transistors M1 to M4, M11, and M12 and the latch circuit 11. In a similar manner, it is possible to provide a multi-input nonvolatile Muller C-element configured with the memory circuit 12 and a Muller C-element with more inputs. Note that a Muller C-element in the semiconductor devices 10 and 13 can employ any other configuration having the same function.

<Buffer>

Figure 3A:
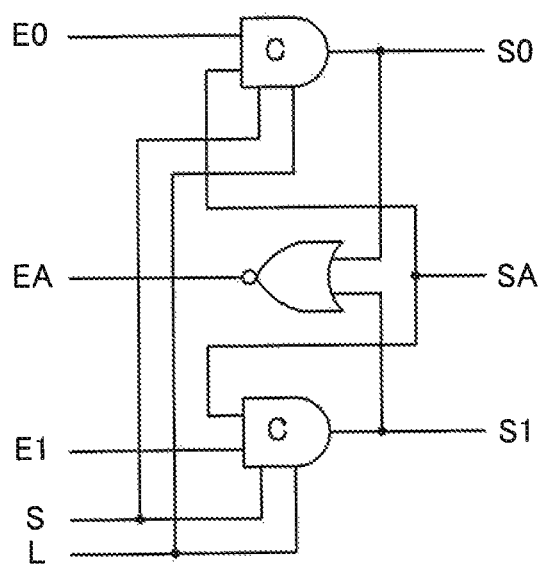
FIGS. 3A and 3B show a circuit diagram illustrating a configuration example of a semiconductor device and a symbol of the semiconductor device.
Figure 3B:
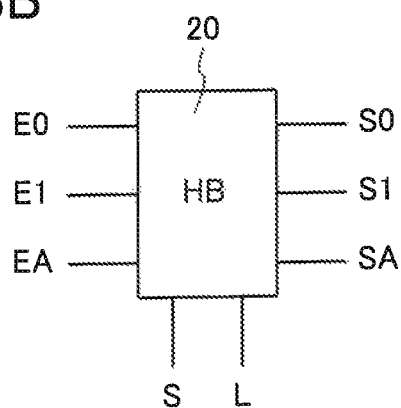

FIG. 3A illustrates a semiconductor device 20 as an example of a buffer formed using the semiconductor device 10. Note that the semiconductor device 20 can be referred to as a half-buffer (HB). The semiconductor device 20 consists of two semiconductor devices 10 and one NOR gate. FIG. 3B shows a symbol of the semiconductor device 20. A signal SA, a signal E0, and a signal E1 are signals input to the semiconductor device 20. A signal EA, a signal S0, and a signal S1 are signals output from the semiconductor device 20.

Figure 4A:
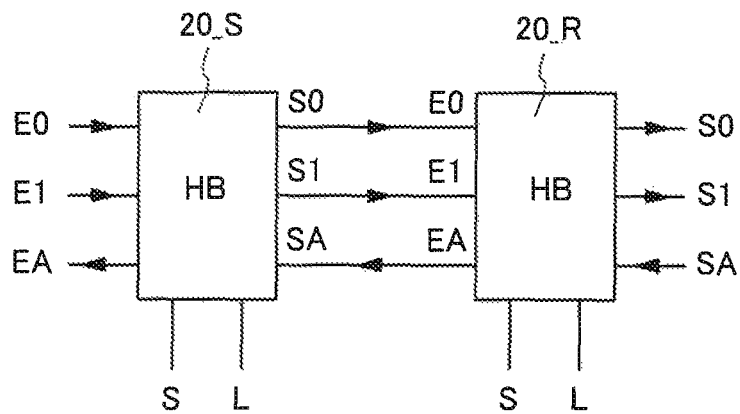
FIGS. 4A and 4B are a circuit diagram of a semiconductor device and a timing chart showing an operation example of the semiconductor device.

FIG. 4A illustrates an example where two semiconductor devices 20 are connected to each other. A semiconductor device 20_S indicates a sender, and a semiconductor device 20_R indicates a receiver. The signal S0 of the semiconductor device 20_S corresponds to the signal E0 of the semiconductor device 20_R, the signal S1 of the semiconductor device 20_S corresponds to the signal E1 of the semiconductor device 20_R, and the signal EA of the semiconductor device 20_R corresponds to the signal SA of the semiconductor device 20_S.

The signals (E0, E1) and the signals (S0, S1) correspond to "two rails" in the four-phase dual-rail protocol described above, and both of these signals correspond to (x, y) in FIGS. 22A to 22C. The signals (E0, E1) and the signals (S0, S1) contain 1-bit data.

Hereinafter, the state where (E0, E1)=(1, 0) and (S0, S1)=(1, 0) is referred to as data "0," the state where (E0, E1)=(0, 1) and (S0, S1)=(0, 1) as data "1," and the state where (E0, E1)=(0, 0) and (S0, S1)=(0, 0) as "spacer" in some cases. Unless otherwise specified, a simple term "data" means the aforementioned data "0" or data "1."

The signals EA and SA correspond to the acknowledgement signal (ack) in FIGS. 22A and 22C. Specifically, the logic of the signals EA and SA corresponds to the inverted logic of the acknowledgement signal (ack) in FIGS. 22A and 22C.

Next, signals input to and output from the HB 20 will be considered using FIGS. 5A to 5F. Note that FIGS. 5A to 5F merely show typical examples to explain operations of the HB 20 and do not include all the operations of the HB 20.

Figure 5A:
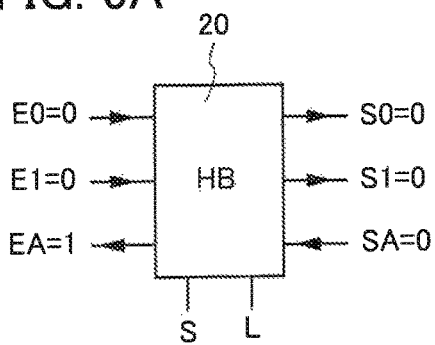
FIGS. 5A to 5F are diagrams illustrating operation examples of a semiconductor device.
Figure 5B:
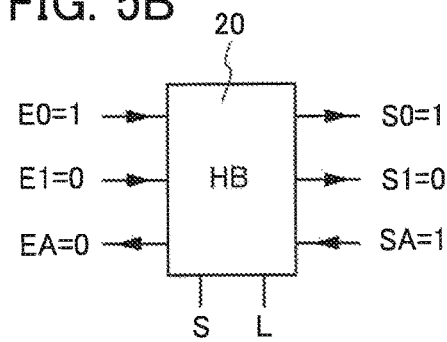
Figure 5C:
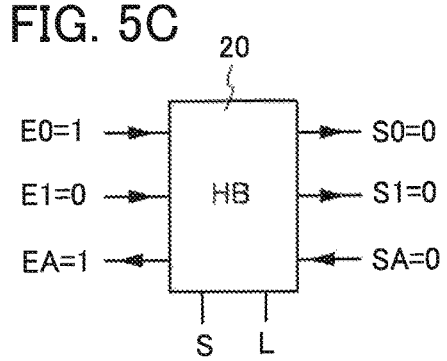

First, the case where the output of the HB 20 is switched from a spacer to data is described using FIGS. 5A to 5C.

FIG. 5A shows the case where SA=0 and a spacer ((E0, E1)=(0, 0)) are input to the HB 20 and the HB 20 outputs EA=1 and a spacer ((S0, S1)=(0, 0)).

FIG. 5B shows the case where SA=1 and data "0" ((E0, E1)=(1, 0)) are input to the HB 20 that is in the state of FIG. 5A. FIG. 5C shows the case where SA=0 and data "0" are input to the HB 20 that is in the state of FIG. 5A.

In FIG. 5B, the HB 20 outputs EA=0 and data "0" ((S0, S1)=(1, 0)). This indicates that the input affects the output and data is updated correctly.

In contrast, in FIG. 5C, the HB 20 outputs EA=1 and the spacer ((S0, S1)=(0, 0)). This indicates that the input does not affect the output and data is not correctly updated.

From FIGS. 5A to 5C, when SA=1, the HB 20 accepts the input of data and can update an output signal from the spacer to the data; whereas when SA=0, the HB 20 does not accept the input of data and thus cannot update an output signal from the spacer to the data.

Figure 5D:
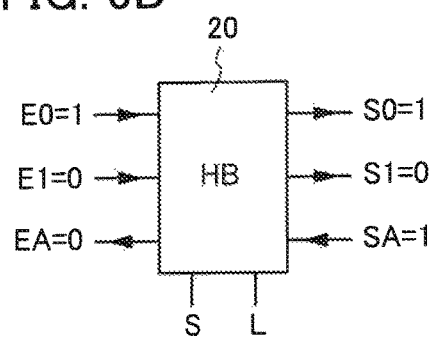
Figure 5E:
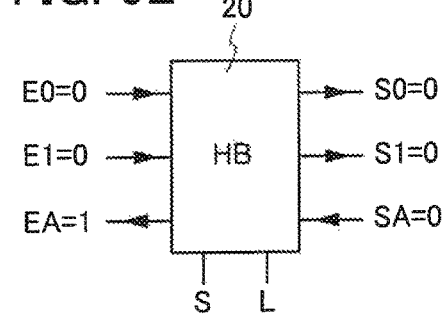
Figure 5F:
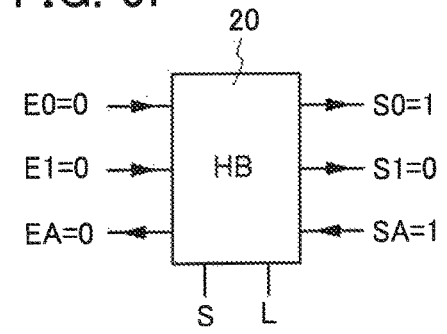

First, the case where the output of the HB 20 is switched from data to a spacer is described using FIGS. 5D to 5F.

FIG. 5D shows the case where SA=1 and data "0" ((E0, E1)=(1, 0)) are input to the HB 20 and the HB 20 outputs EA=0 and data "0" ((S0, S1)=(1, 0)).

FIG. 5E shows the case where SA=0 and the spacer ((E0, E1)=(0, 0)) are input to the HB 20 that is in the state of FIG. 5D. FIG. 5F shows the case where SA=1 and the spacer are input to the HB 20 that is in the state of FIG. 5D.

In FIG. 5E, the HB 20 outputs EA=1 and the spacer ((S0, S1)=(0, 0)). This indicates that the input affects the output and data is updated correctly.

In contrast, in FIG. 5F, the HB 20 outputs EA=0 and data "0" ((S0, S1)=(1, 0)). This indicates that the input does not affect the output and data is not correctly updated.

From FIGS. 5D to 5F, when SA=0, the HB 20 accepts the input of a spacer and can update an output signal from data to the spacer; whereas when SA=1, the HB 20 does not accept the input of a spacer and thus cannot update an output signal from data to the spacer.

In summary, when SA=1, the HB 20 accepts the change in input only when the input is changed from a spacer to data, and changes its output from a spacer to data. Meanwhile, when SA=0, the HB 20 accepts the change in input only when the input is changed from data to a spacer, and changes its output from data to a spacer.

Then, the HB 20_S and the HB 20_R shown in FIG. 4A are considered again.

Figure 4B:
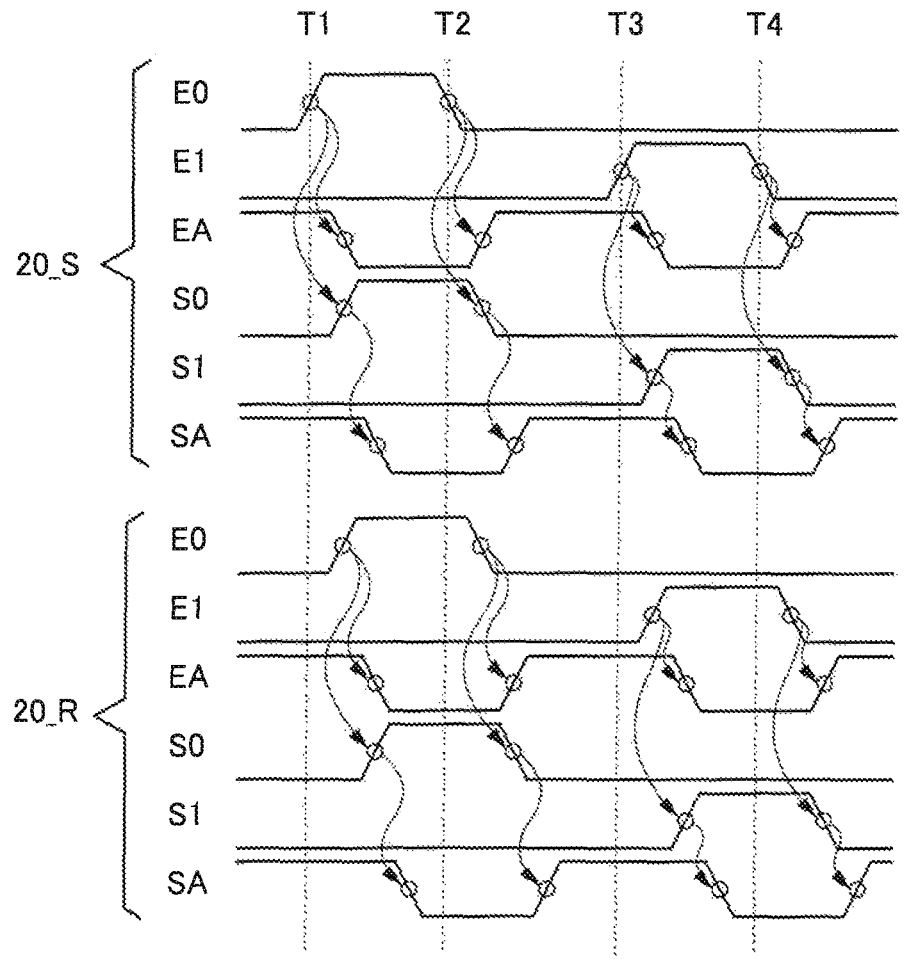

FIG. 4B is a timing chart showing an operation example of the circuits in FIG. 4A. In FIG. 4B, time T1 to time T4 are shown to indicate the operation timing. As an initial state, (E0, E1, EA, S0, S1, SA)=(0, 0, 1, 0, 0, 1) are set in both the semiconductor device 20_S and the semiconductor device 20R.

At the time T1, (E0, E1) in the semiconductor device 20_S are changed from (0, 0) to (1, 0). That is, data "0" is input to the semiconductor device 20_S. Since SA=1 at this time, the semiconductor device 20_S outputs (S0, S1, EA)= (1, 0, 0) after a certain delay time. That is, the semiconductor device 20_S updates the output signal to data "0."

In response to the output of the semiconductor device 20_S, the semiconductor device 20_R also outputs (S0, S1, EA)=(1, 0, 0) after a certain delay time. That is, the semiconductor device 20_R also updates the output signal to data "0." The semiconductor device 20_S receives SA=0, i.e., a signal indicating that the semiconductor device 20_S can change its output from the data to a spacer.

At the time T2, (E0, E1) in the semiconductor device 20_S are changed from (1, 0) to (0, 0). That is, a spacer is input to the semiconductor device 20_S. Since SA=0 at this time, the semiconductor device 20_S outputs (S0, S1, EA)= (0, 0, 1) after a certain delay time. That is, the semiconductor device 20_S updates the output signal from data "0" to the spacer.

In response to the output of the semiconductor device 20_S, the semiconductor device 20_R also outputs (S0, S1, EA)=(0, 0, 1) after a certain delay time. That is, the semiconductor device 20_R also updates the output signal from data "0" to a spacer. The semiconductor device 20_S receives SA=1, i.e., a signal indicating that the semiconductor device 20_S can change its output from the spacer to data.

At the time T3, (E0, E1) in the semiconductor device 20_S are changed from (0, 0) to (0, 1). That is, data "1" is input to the semiconductor device 20_S. Since SA=1 at this time, the semiconductor device 20_S outputs (S0, S1, EA)= (0, 1, 0) after a certain delay time. That is, the semiconductor device 20_S updates the output signal from the spacer to data "1."

The subsequent operations are similar to the above; therefore, the description is omitted.

Note that the above delay time depends on parasitic resistance of a wiring, parasitic capacitance, driving capability of a previous-stage circuit, capacitance of a next-stage circuit, or the like.

When updating its output signal to data "0" or data "1," the semiconductor device 20_R informs the semiconductor device 20_S, by outputting EA=0, that the semiconductor device 20_R cannot receive new data. By receiving SA=0, the semiconductor device 20_S learns that the semiconductor device 20_R is in a state unable to receive new data.

At the same time, by receiving SA=0, the semiconductor device 20_S learns that the semiconductor device 20_R is in a state capable of receiving a spacer. When receiving the spacer, the semiconductor device 20_R outputs EA=1 and informs the semiconductor device 20_S that the semiconductor device 20_R is in a state capable of receiving new data. The semiconductor device 20_S receives SA=1 and learns that the semiconductor device 20R is in a state capable of receiving new data. Then, the semiconductor device 20_S sends new data to the semiconductor device 20R.

The summary of the above description is as follows:

(1) when SA=1, the semiconductor device 20 is in a state capable of sending data to the next-stage semiconductor device;

(2) when SA=0, the semiconductor device 20 is in a state unable to send data to the next-stage semiconductor device;

(3) when EA=1, the semiconductor device 20 is in a state capable of receiving data from the previous-stage semiconductor device; and (4) when EA=0, the semiconductor device 20 is in a state unable to receive data from the previous-stage semiconductor device.

<Buffer and Logic Circuit>

Figure 6:
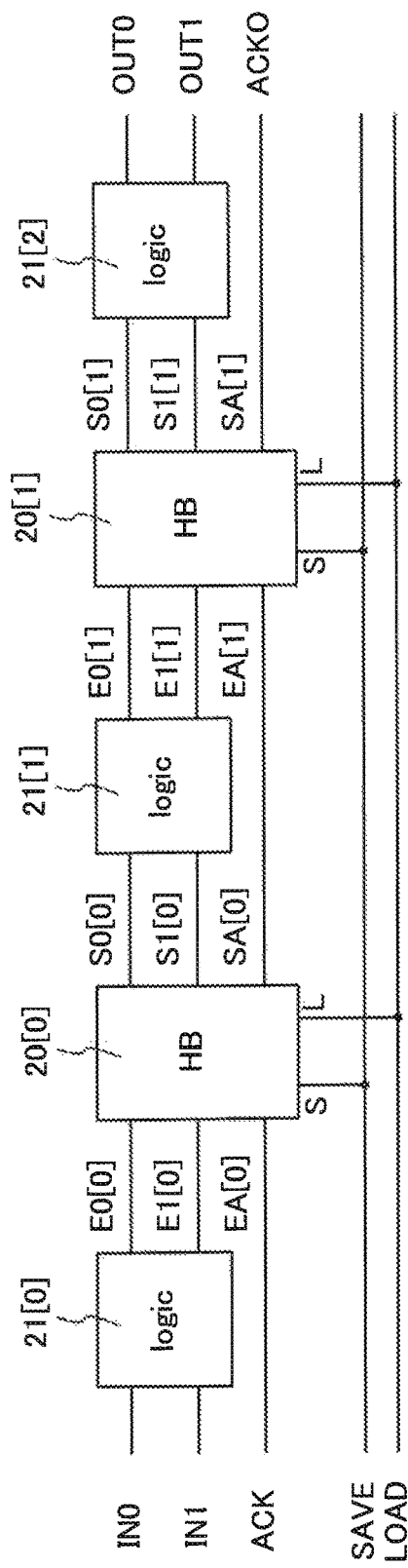
FIG. 6 is a block diagram illustrating a configuration example of a semiconductor device.

FIG. 6 illustrates a semiconductor device 27 in which a semiconductor devices 21[0], a semiconductor device 20[0], a semiconductor device 21[1], a semiconductor device 20[1], and a semiconductor devices 21[2] are connected in this order. The semiconductor device 21 can be any logic circuit that can generate outputs for two signal lines with respect to inputs from two signal lines.

A signal IN0 and a signal IN1 are input to the semiconductor device 21[0]. A signal OUT0 and a signal OUT1 are output from the semiconductor device 21[2]. A signal ACK is output from the semiconductor device 20[0] as a signal EA[0]. A signal ACKO is input to the semiconductor device 20[1] as a signal SA[1]. A signal SAVE is input to each of the semiconductor devices 20 as the signal S. A signal LOAD is input to each of the semiconductor devices 20 as the signal L.

Figure 7:
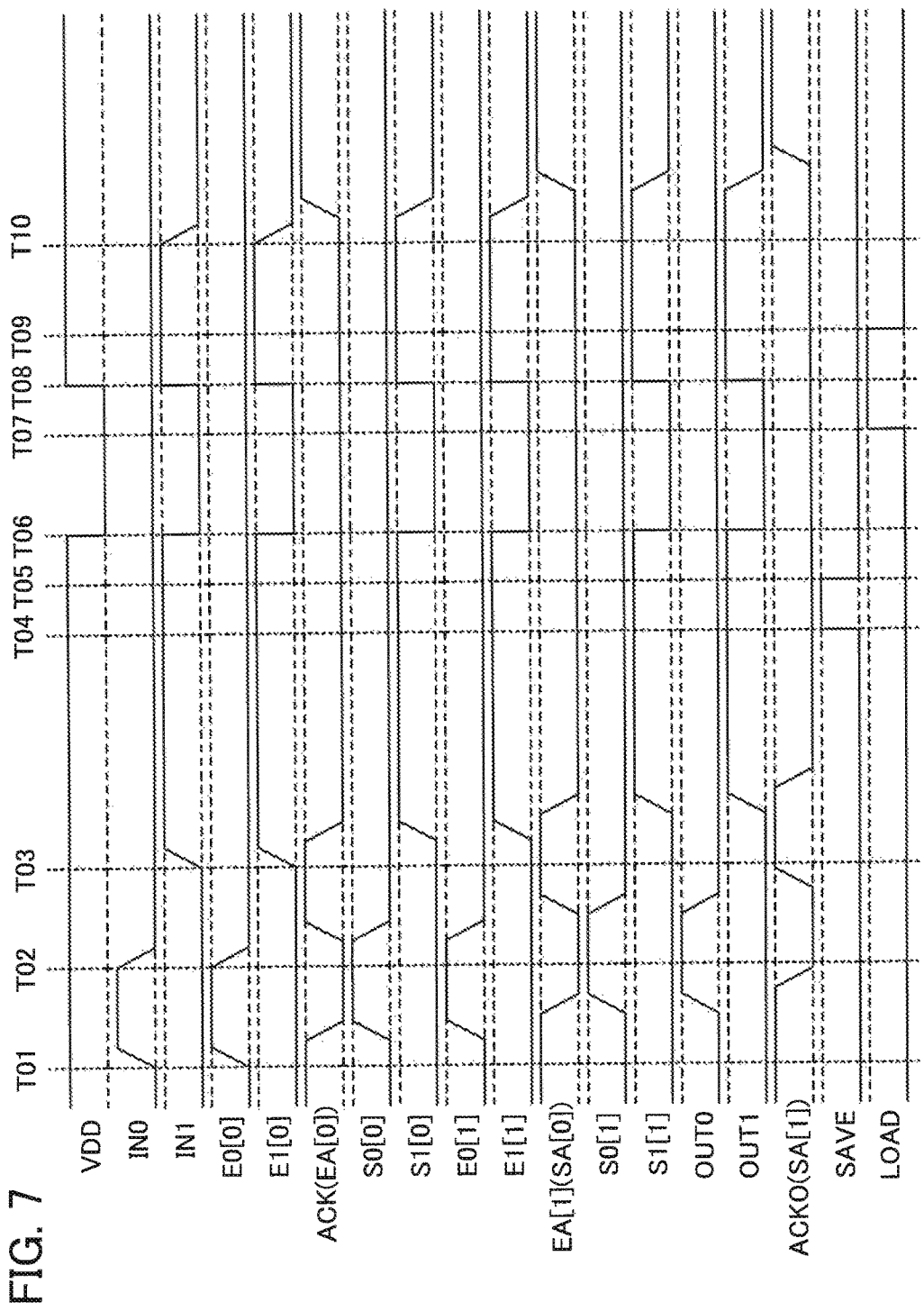
FIG. 7 is a timing chart showing an operation example of a semiconductor device.

FIG. 7 is a timing chart showing the operation of the semiconductor device 27. In the timing chart, time T01 to time T10 are shown to indicate the operation timing. As an initial state, the signals of the semiconductor devices 20 are set as (E0, E1, EA, S0, S1, SA)=(0, 0, 1, 0, 0, 1). Each of the semiconductor devices 20 is in a state capable of receiving data from the previous-stage semiconductor device because EA=1, and is in a state capable of sending data to the next-stage semiconductor device because SA=1.

At the time T01, when (IN0, IN1) are changed from (0, 0) to (1, 0), (E0[0], E1[0]) are changed through the semiconductor device 21[0]. Here, (E0[0], E1[0]) are changed from (0, 0) to (1, 0). After a certain delay time, (S0[0], S1[0], EA[0]) become (1, 0, 0). The semiconductor device 20[0] is in a state unable to receive data because EA[0]=0.

When the signals (S0[0], S1[0]) are changed, (E0[1], E1[1]) are changed through the semiconductor device 21[1]. Here, (E0[1], E1[1]) are changed from (0, 0) to (1, 0). After a certain delay time, (S0[1], S1[1], EA[1] (SA[0])) become (1, 0, 0). The semiconductor device 20[1] is in a state unable to receive data because EA[1]=0. Meanwhile, the semiconductor device 20[0] is in a state unable to send data because SA[0]=0.

When the signals (S0[1], S1[1]) are changed, (OUT0, OUT1) are changed through the semiconductor device 21[2]. Here, (OUT0, OUT1) are changed from (0, 0) to (1, 0). After a certain delay time, ACKO (SA[1]) becomes 0. This corresponds to the fact that changes in the signals (OUT0, OUT1) are detected outside the semiconductor device 27. The semiconductor device 20[1] is in a state unable to send data because SA[1]=0 at this time.

At the time T02, when (IN0, IN1) are changed from (1, 0) to (0, 0), (E0[0], E1[0]) are changed from (1, 0) to (0, 0) through the semiconductor device 21[0]. After a certain delay time, (S0[0], S1[0], EA[0]) become (0, 0, 1). The semiconductor device 20[0] is in a state capable of receiving data because EA[0]=1.

When the signals (S0[0], S1[0]) are changed, (E0[1], E1[1]) are changed from (1, 0) to (0, 0) through the semiconductor device 21[1]. After a certain delay time, (S0[1], S1[1], EA[1] (SA[0])) become (0, 0, 1). The semiconductor device 20[1] is in a state capable of receiving data because EA[1]=1. Meanwhile, the semiconductor device 20[0] is in a state capable of sending data because SA[0]=1.

When the signals (S0[1], S1[1]) are changed, (OUT0, OUT1) are changed from (1, 0) to (0, 0) through the semiconductor device 21[2]. After a certain delay time, ACKO (SA[1]) becomes 1. This corresponds to the fact that changes in the signals (OUT0, OUT1) are detected outside the semiconductor device 27. The semiconductor device 20[1] is in a state capable of sending data because SA[1]=1.

At the time T03, when (IN0, IN1) are changed from (0, 0) to (0, 1), (E0[0], E1[0]) are changed through the semiconductor device 21[0]. Here, (E0[0], E1[0]) are changed from (0, 0) to (0, 1). After a certain delay time, (S0[0], S1[0], EA[0]) become (0, 1, 0). The semiconductor device 20[0] is in a state unable to receive data because EA[0]=0.

When the signals (S0[0], S1[0]) are changed, (E0[1], E1[1]) are changed through the semiconductor device 21[1]. Here, (E0[1], E1[1]) are changed from (0, 0) to (0, 1). After a certain delay time, (S0[1], S1[1], EA[1] (SA[0])) become (0, 1, 0). The semiconductor device 20[1] is in a state unable to receive data because EA[1]=0. Meanwhile, the semiconductor device 20[0] is in a state unable to send data because SA[0]=0.

When the signals (S0[1], S1[1]) are changed, (OUT0, OUT1) are changed through the semiconductor device 21[2]. Here, (OUT0, OUT1) are changed from (0, 0) to (0, 1). After a certain delay time, ACKO (SA[1]) becomes 0. This corresponds to the fact that changes in the signals (OUT0, OUT1) are detected outside the semiconductor device 27. The semiconductor device 20[1] is in a state unable to send data because SA[1]=0 at this time.

The states of the semiconductor devices 20 just before the time T04 are as follows: both of the semiconductor devices 20[0] and 20[1] are in a state unable to send or receive data, and their signals are (S0[0], S1[0])=(0, 1), (S0[1], S1[1])=(0, 1), EA[0]=0, and EA[1]=0.

From the time T04 to the time T05, by setting SAVE=1, data held in the latch circuit 11 of the semiconductor device 10 included in the semiconductor device 20 is stored in the memory circuit 12 (see FIG. 1A). The memory circuit 12 functions as a nonvolatile register.

From the time T06 to the time T07, supply of the power supply voltage is stopped. At this time, each of the signals becomes 0. Note that the data in the memory circuit 12 included in the semiconductor device 20 is not lost. Specifically, the potentials stored in the capacitor C1 and the capacitor C2 are held even while supply of the power supply voltage is stopped.

While LOAD=1 is set from the time T07 to the time T09, supply of the power supply voltage is restarted and (IN0, IN1)=(0, 1) and ACKO (SA[1])=0 are set at the time T08. At the time T08, the data in the memory circuit 12 is restored to the latch circuit 11, and the signals (S0[0], S1[0]) become (0, 1), (S0[1], S1[1]) become (0, 1), EA[0] becomes 0, and EA[1] becomes 0. The semiconductor devices 20[0] and 20[1] are in a state unable to send or receive data. In other words, the semiconductor devices 20 can be returned to the state just before supply of the power supply voltage is stopped.

At the time T10, when (IN0, IN1) are changed from (0, 1) to (0, 0), (E0[0], E1[0]) are changed from (0, 1) to (0, 0) through the semiconductor device 21[0]. After a certain delay time, (S0[0], S1[0], EA[0]) become (0, 0, 1). The semiconductor device 20[0] is in a state capable of receiving data because EA[0]=1.

When the signals (S0[0], S1[0]) are changed, (E0[1], E1[1]) are changed from (0, 1) to (0, 0) through the semiconductor device 21[1]. After a certain delay time, (S0[1], S1[1], EA[1] (SA[0])) become (0, 0, 1). The semiconductor device 20[1] is in a state capable of receiving data because EA[1]=1. Meanwhile, the semiconductor device 20[0] is in a state capable of sending data because SA[0]=1.

When the signals (S0[1], S1[1]) are changed, (OUT0, OUT1) are changed from (0, 1) to (0, 0) through the semiconductor device 21[2]. After a certain delay time, ACKO (SA[1]) becomes 1. This corresponds to the fact that changes in the signals (OUT0, OUT1) are detected outside the semiconductor device 27. The semiconductor device 20[1] is in a state capable of sending data because SA[1]=1.

The semiconductor device 27 can operate as an asynchronous circuit by subsequently repeating similar operations. Moreover, the semiconductor device 27 can perform power gating by stopping power supply while the semiconductor device 27 does not operate. As a result, power consumption of the semiconductor device 27 can be reduced.

<NOT Circuit>

Figure 8A:
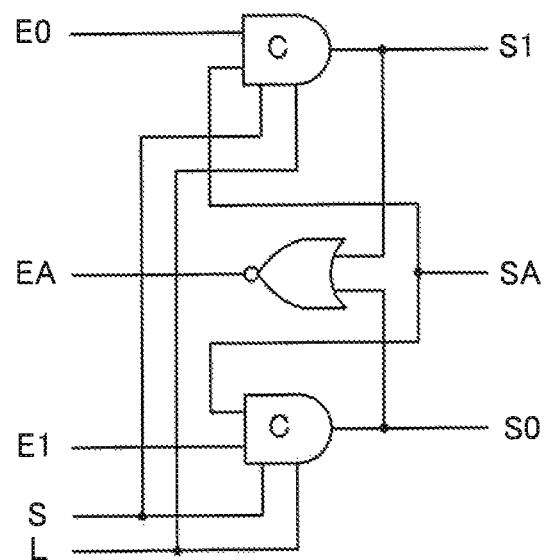
FIGS. 8A and 8B show a circuit diagram illustrating a configuration example of a semiconductor device and a symbol of the semiconductor device.

FIG. 8A illustrates a semiconductor device 22 as an example of a NOT circuit formed using the semiconductor device 10. The semiconductor device 22 consists of two semiconductor devices 10 and one NOR gate. The semiconductor device 22 is configured such that positions where the signal S1 and the signal S0 are output in the semiconductor device 20 are replaced with each other.

Figure 8B:
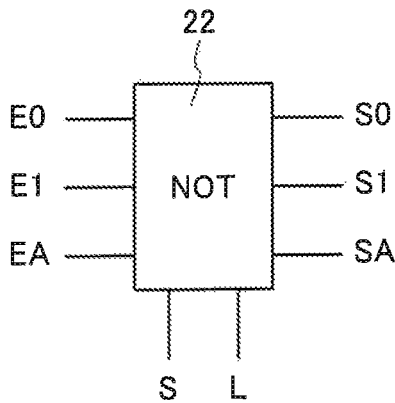

FIG. 8B shows a symbol of the semiconductor device 22. As in the semiconductor device 20, (E0, E1) contain data (input) and (S0, S1) contain data (output). The signal SA is an acknowledgement signal (input), and the signal EA is an acknowledgement signal (output).

<AND Circuit>

Figure 9A:
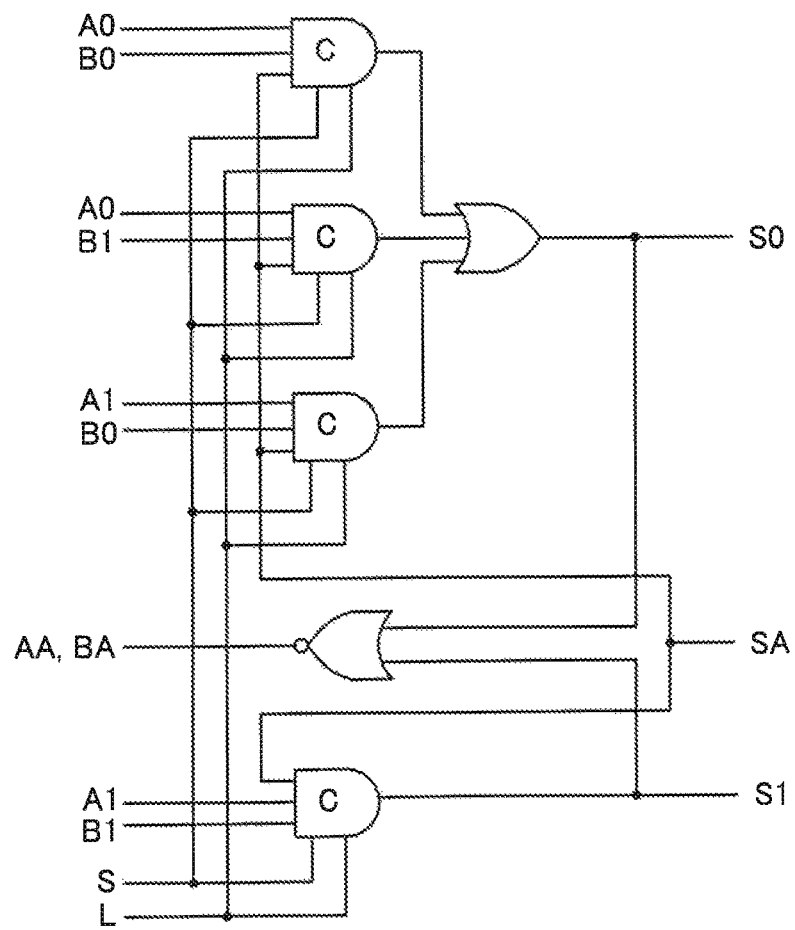
FIGS. 9A and 9B show a circuit diagram illustrating a configuration example of a semiconductor device and a symbol of the semiconductor device.

FIG. 9A illustrates a semiconductor device 23 as an example of an AND circuit formed using the semiconductor device 13. The semiconductor device 23 consists of four semiconductor devices 13, one OR gate, and one NOR gate.

Figure 9B:
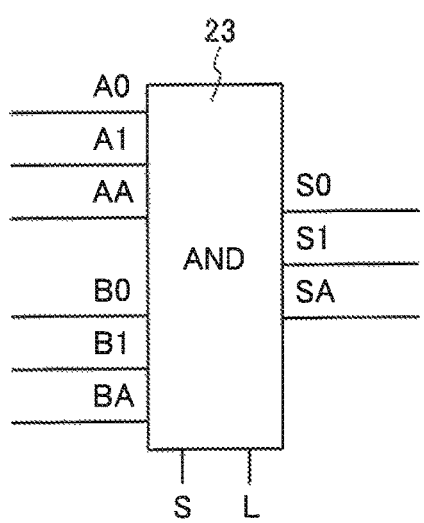

FIG. 9B shows a symbol of the semiconductor device 23. The signal SA, a signal A0, a signal A1, a signal B0, and a signal B1 are signals input to the semiconductor device 23. A signal AA, a signal BA, the signal S0, and the signal S1 are signals output from the semiconductor device 23.

The signals (A0, A1), (B0, B1), and (S0, S1) correspond to (x, y) in FIGS. 22A to 22C and contain 1-bit data. The signals AA, BA, and SA correspond to the acknowledgement signal (ack) in FIGS. 22A and 22C.

Figure 10A:
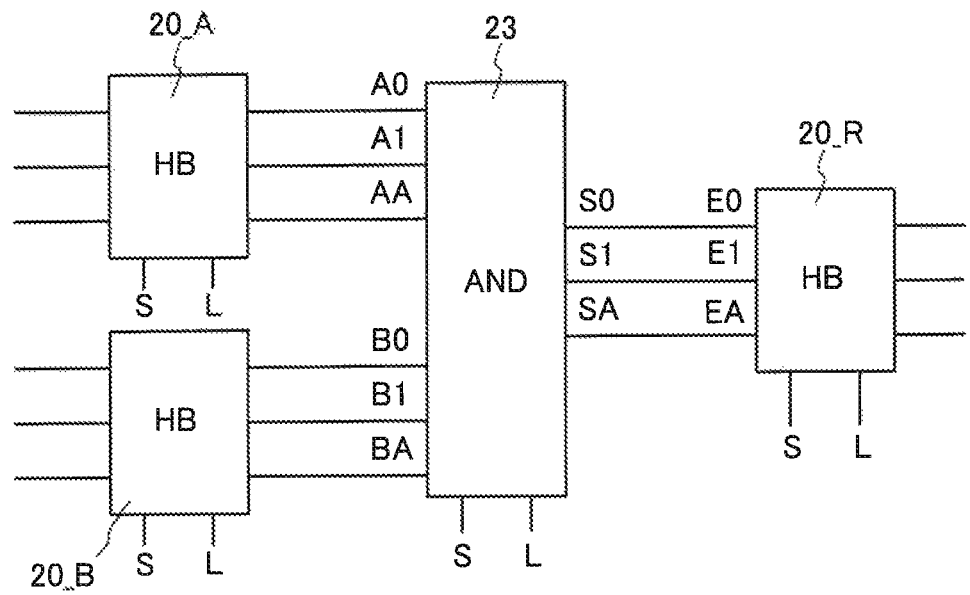
FIGS. 10A and 10B are a block diagram illustrating a configuration example of a semiconductor device and a timing chart showing an operation example of the semiconductor device.

Next, the operation of the semiconductor device 23 will be described with reference to FIGS. 10A and 10B. FIG. 10A is a block diagram of a circuit in which the semiconductor devices 20 are connected to inputs and outputs of the semiconductor device 23. The semiconductor devices 20 connected to the semiconductor device 23 are referred to as a semiconductor device 20_A, a semiconductor device 20_B, and a semiconductor device 20_R as shown in FIG. 10A.

Figure 10B:
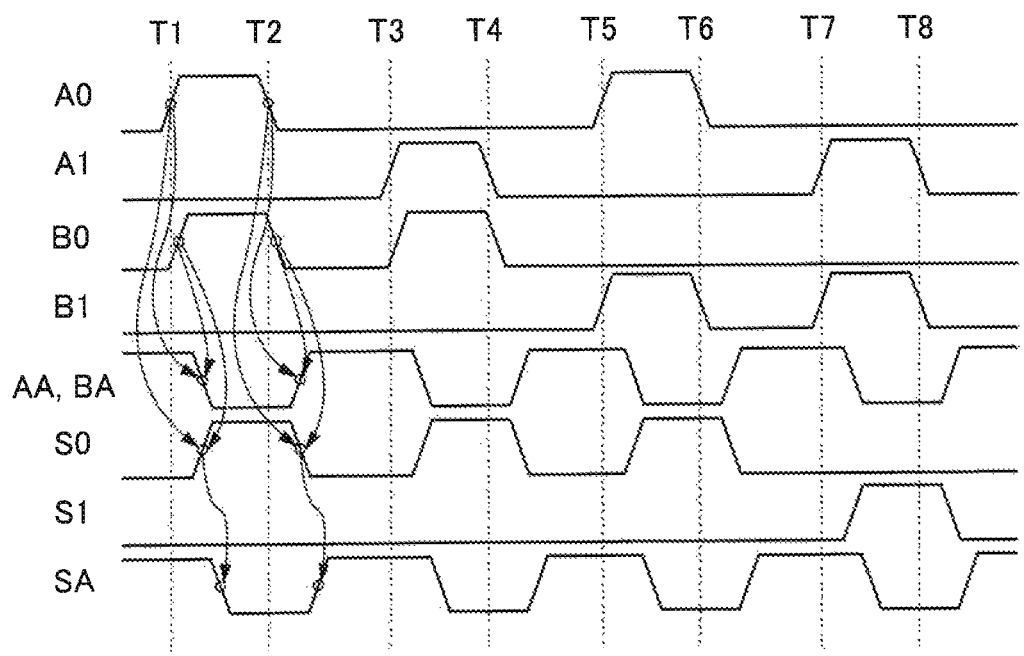

FIG. 10B is a timing chart showing the operation of the semiconductor device 23 in FIG. 10A. In the timing chart, time T1 to time T8 are shown to indicate the operation timing. As an initial state, (A0, A1, B0, B1, AA (BA), S0, S1, SA)=(0, 0, 0, 0, 1, 0, 0, 1) are set.

At the time T1, in the semiconductor device 23, (A0, A1) are changed from (0, 0) to (1, 0), and (B0, B1) are changed from (0, 0) to (1, 0). That is, data "0" and data "0" are input to the semiconductor device 23. Since SA=1 at this time, the semiconductor device 23 outputs (S0, S1, AA (BA))=(1, 0, 0) after a certain delay time. That is, the semiconductor device 23 outputs data "0," which is logical AND of "0" and "0."

In response to the output of the semiconductor device 23, the semiconductor device 20_R outputs EA=0 after a certain delay time. The semiconductor device 23 receives SA=0.

Note that at the time T1, data input for (A0, A1) and data input for (B0, B1) are not always performed at the same time. The timing of updating (S0, S1, AA (BA)) depends on the latter timing of data input for (A0, A1) and (B0, B1). In FIG. 10B, data input for (B0, B1) is slightly behind data input for (A0, A1). Thus, the timing of updating (S0, S1, AA (BA)) depends on the timing of data input for (B0, B1). Here, AA=1 is kept until data input for (B0, B1) is performed, and data for (A0, A1) is not changed. That is, the next data for (A0, A1) is not sent. Such a configuration enables stable data transmission with the four-phase dual-rail protocol.

At the time T2, in the semiconductor device 23, (A0, A1) are changed from (1, 0) to (0, 0) and (B0, B1) are changed from (1, 0) to (0, 0). That is, two spacers are input to the semiconductor device 23. Since SA=0 at this time, the semiconductor device 23 outputs (S0, S1, EA)=(0, 0, 1) after a certain delay time. That is, the semiconductor device 20_S updates the output signal from data "0" to the spacer.

In response to the output of the semiconductor device 23, the semiconductor device 20_R outputs EA=1 after a certain delay time. The semiconductor device 23 receives SA=1.

Note that when there is a time lag between the change of (A0, A1) to the spacer and the change of (B0, B1) to the spacer, the output changes after a certain delay time at the timing of the latter change. That is, (S0, S1) are not changed to the spacer until both of the inputs become the spacer. Moreover, AA (BA)=0 is kept until both of the inputs become the spacer, and data for (A0, A1) and data for (B0, B1) are not changed. That is, the next data for (A0, A1) and the next data for (B0, B1) are not sent. Such a configuration enables stable data transmission with the four-phase dual-rail protocol.

Although the detailed description of the subsequent operations is omitted, the semiconductor device 23 repeats data input and output as an AND circuit.

At the time T3, in the semiconductor device 23, (A0, A1) are changed from (0, 0) to (0, 1) and (B0, B1) are changed from (0, 0) to (1, 0). That is, data "1" and data "0" are input to the semiconductor device 23. Thus, the semiconductor device 23 outputs (S0, S1)=(1, 0), that is, data "0."

At the time T5, in the semiconductor device 23, (A0, A1) are changed from (0, 0) to (1, 0) and (B0, B1) are changed from (0, 0) to (0, 1). That is, data "0" and data "1" are input to the semiconductor device 23. As a result, the semiconductor device 23 outputs (S0, S1)=(1, 0), that is, data "0."

At the time T7, in the semiconductor device 23, (A0, A1) are changed from (0, 0) to (0, 1) and (B0, B1) are changed from (0, 0) to (0, 1). That is, data "1" and data "1" are input to the semiconductor device 23. Thus, the semiconductor device 23 outputs (S0, S1)=(0, 1), that is, data "1."

It is clear from the above description that the semiconductor device 23 functions as an AND circuit.

<NAND Circuit>

Figure 11A:
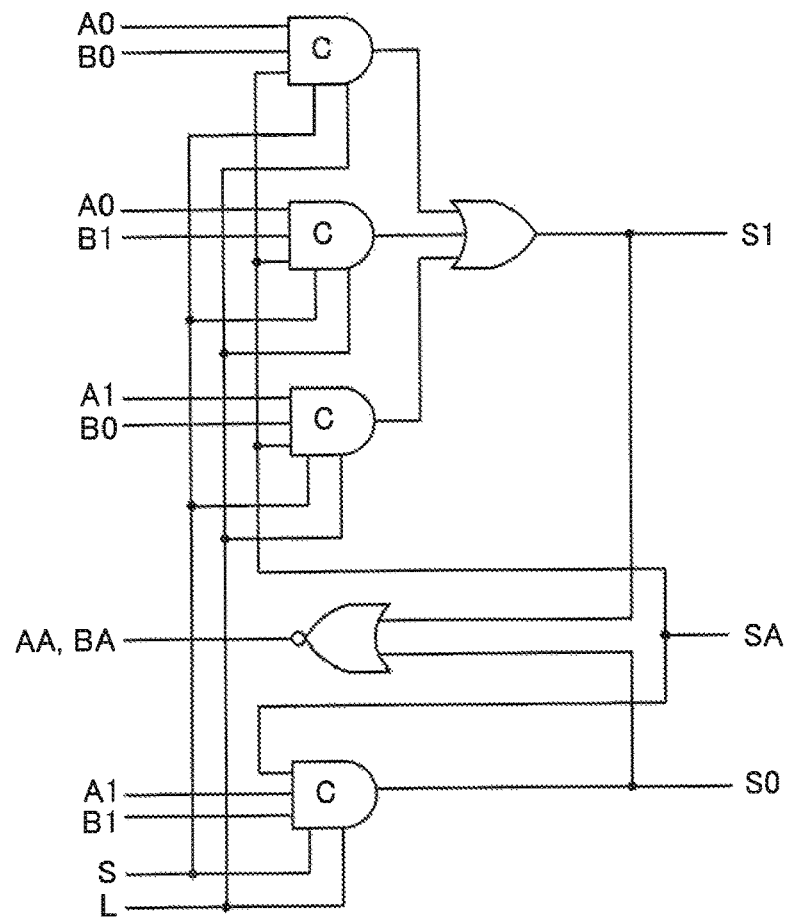
FIGS. 11A and 11B show a circuit diagram illustrating a configuration example of a semiconductor device and a symbol of the semiconductor device.

FIG. 11A illustrates a semiconductor device 24 as an example of a NAND circuit formed using the semiconductor device 13. The semiconductor device 24 consists of four semiconductor devices 13, one OR gate, and one NOR gate. The semiconductor device 24 is configured such that positions where the signal S1 and the signal S0 are output in the semiconductor device 23 are replaced with each other.

Figure 11B:
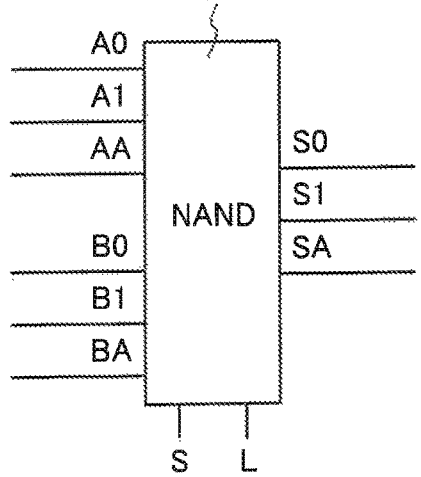

FIG. 11B shows a symbol of the semiconductor device 24. As in the semiconductor device 23, (A0, A1) and (B0, B1) contain data (input), and (S0, S1) contain data (output). The signal SA is an acknowledgement signal (input), and the signals AA and BA are an acknowledgement signal (output).

<OR Circuit>

Figure 12A:
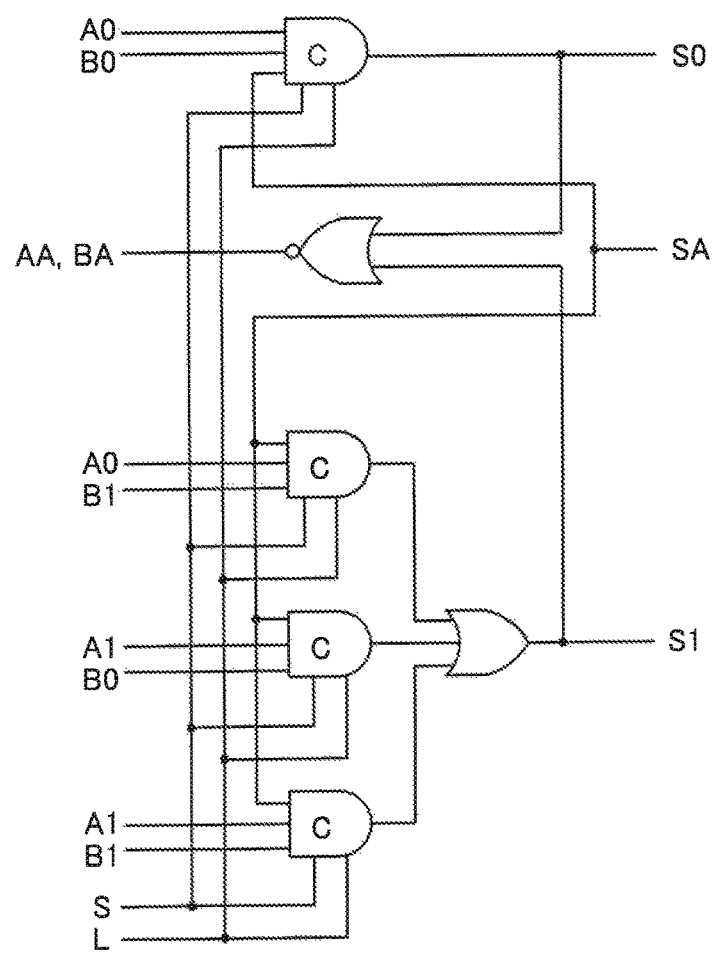
FIGS. 12A and 12B show a circuit diagram illustrating a configuration example of a semiconductor device and a symbol of the semiconductor device.

FIG. 12A illustrates a semiconductor device 25 as an example of an OR circuit formed using the semiconductor device 13. The semiconductor device 25 consists of four semiconductor devices 13, one OR gate, and one NOR gate.

Figure 12B:
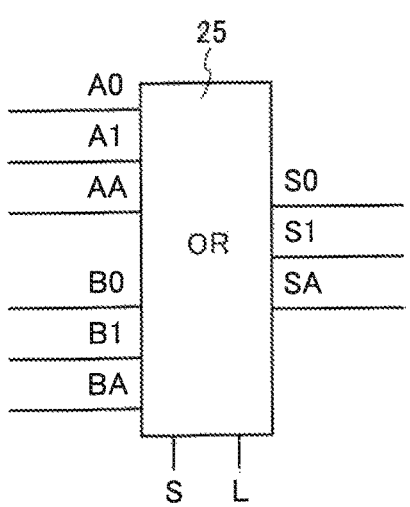

FIG. 12B shows a symbol of the semiconductor device 25. As in the semiconductor device 23, (A0, A1) and (B0, B1) contain data (input), and (S0, S1) contain data (output). The signal SA is an acknowledgement signal (input), and the signals AA and BA are an acknowledgement signal (output).

<NOR Circuit>

Figure 13A:
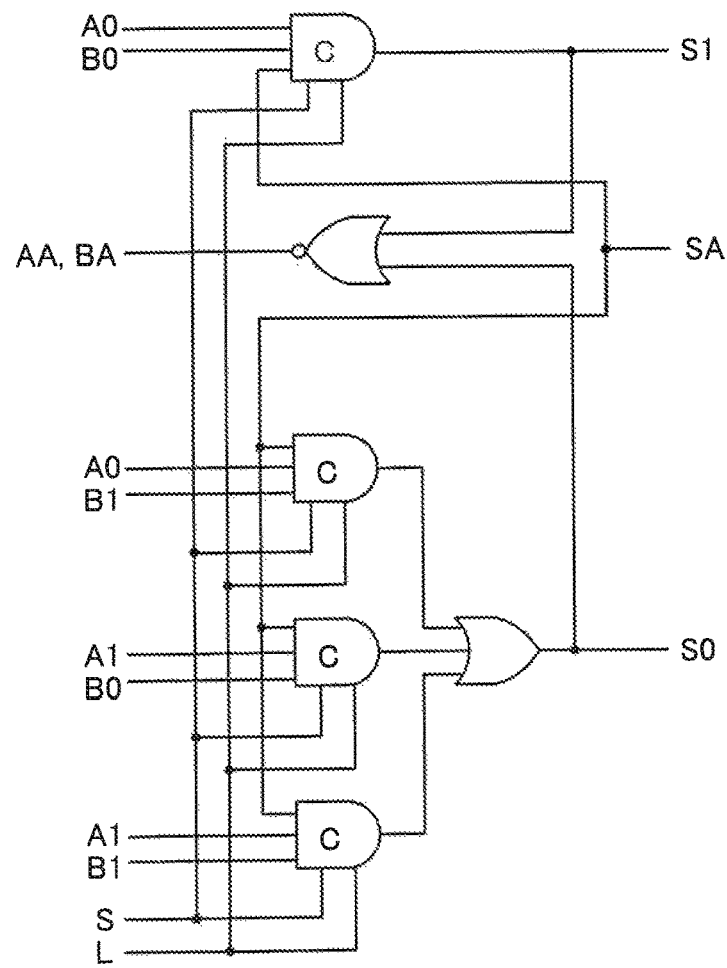
FIGS. 13A and 13B show a circuit diagram illustrating a configuration example of a semiconductor device and a symbol of the semiconductor device.

FIG. 13A illustrates a semiconductor device 26 as an example of a NOR circuit formed using the semiconductor device 13. The semiconductor device 26 consists of four semiconductor devices 13, one OR gate, and one NOR gate.

Figure 13B:
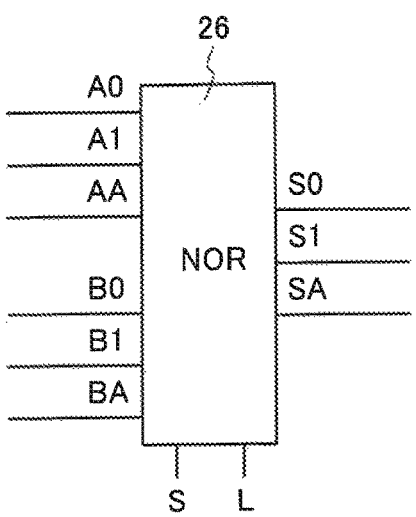

FIG. 13B shows a symbol of the semiconductor device 26. As in the semiconductor device 23, (A0, A1) and (B0, B1) contain data (input), and (S0, S1) contain data (output). The signal SA is an acknowledgement signal (input), and the signals AA and BA are an acknowledgement signal (output).

The use of the semiconductor device described in this embodiment facilitates power gating of an asynchronous circuit, resulting in lower power consumption of the semiconductor device.

Embodiment 2

This embodiment will explain a display device that can include the semiconductor device shown in Embodiment 1.

<Display Device 100>

Figure 14:
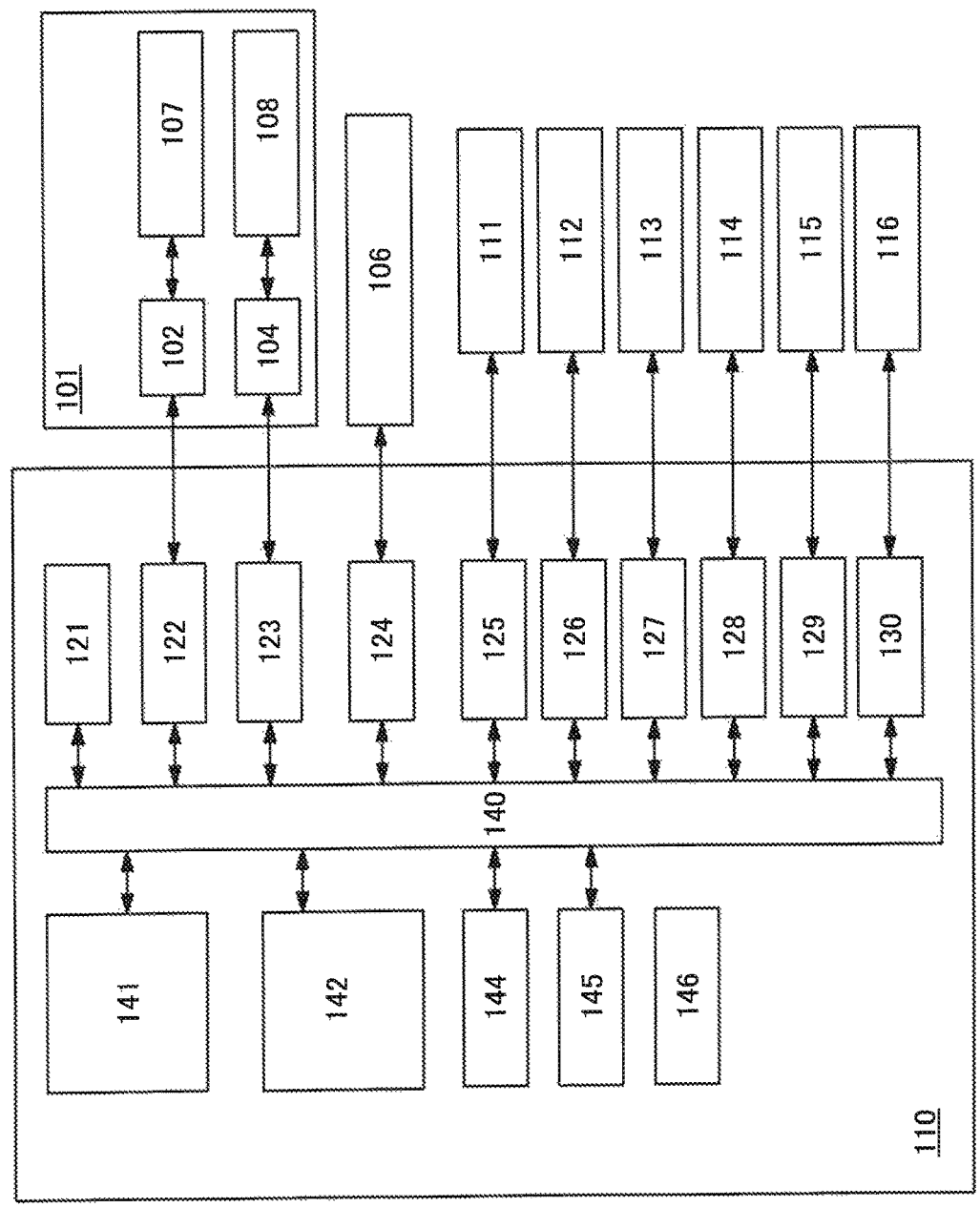
FIG. 14 is a block diagram illustrating a configuration example of a display device.

FIG. 14 is a block diagram illustrating a configuration example of a display device 100. The display device 100 includes an application processor (hereinafter "AP") 110, a display panel 101, a touch panel 106, a dynamic random access memory (DRAM) 111, a flash memory 112, a solid state drive (SSD) 113, an RF tag 114, a TV tuner 115, and a sensor 116.

The AP 110 includes a graphics processing unit (GPU) 121, a display_IF (IF: interface) 122, a display_IF 123, a touch panel_IF 124, a DRAM_IF 125, a flash memory_IF 126, an SSD_IF 127, a network_IF 128, a universal serial bus (USB)_IF 129, an analog circuit 130, a system bus 140, a processor core 141, a memory 142, a power control circuit 144, a field programmable gate array (FPGA) 145, and a clock generator circuit 146.

The AP 110 is connected to the display panel 101 through the display_IF 122 and the display_IF 123, connected to the touch panel 106 through the touch panel_IF 124, connected to the DRAM 111 through the DRAM_IF 125, connected to the flash memory 112 through the flash memory_IF 126, connected to the SSD 113 through the SSD_IF 127, connected to the RF tag 114 through the network_IF 128, connected to the TV tuner 115 through the USB_IF 129, and connected to the sensor 116 through the analog circuit 130.

The processor core 141 has a function of controlling the overall AP 110. The processor core 141 transmits instructions and data to each circuit through the system bus 140. For example, the processor core 141 runs basic software (an operating system: OS) and various kinds of application software using the memory 142, the DRAM 111, and the SSD 113 as a cache memory, a main memory device, and an external memory device, respectively. Note that the processor core 141 can have a single-core, dual-core, or multi-core architecture or have a cache memory hierarchy such as Level 1 (L1) and Level 2 (L2), as determined by the computational performance required for a system.

The AP 110 has a function of supplying a video signal stored in an external memory device such as the DRAM 111, the flash memory 112, or the SSD 113 to the display panel 101. The AP 110 can also supply a video signal received by the TV tuner 115 to the display panel 101.

The GPU 121 is a processor specialized for image processing. The GPU 121 can perform advanced image processing such as three-dimensional image processing. Image data generated in the GPU 121 is transmitted to the display panel 101 through the display_IFs 122 and 123, and an image based on the image data is displayed on the display panel 101.

A user of the display device 100 can input information from the touch panel 106. The AP 110 senses a touch signal input by the user and updates an image on the display panel 101.

The touch panel 106 can be a resistive touch panel or a capacitive touch panel and can be used by overlapping the display panel 101.

The display panel 101 includes a display driver IC (DDI) 102, a reflective element 107, a DDI 104, and a light-emitting element 108.

The DDI 102 has a function of driving the reflective element 107. The DDI 102 is connected to the AP 110 through the display_IF 122.

The DDI 104 has a function of driving the light-emitting element 108. The DDI 104 is connected to the AP 110 through the display_IF 123.

The display_IFs 122 and 123 have a function of converting one video signal into another video signal with a format compatible with the display panel 101. The display_IFs 122 and 123 each include a correction circuit (for gamma correction, chromaticity correction, luminance correction, or the like), a decoder, and a frame memory, for example.

The reflective element 107 is a display element that displays an image by utilizing reflection of external light and can be, for example, a liquid crystal element, a shutter-type microelectromechanical systems (MEMS) element, an optical-interference-type MEMS element, an element employing a microcapsule method, an electrophoretic element, an electrowetting element, or electronic liquid powder (registered trademark). The use of a reflective display element in the display panel 101 leads to a reduction in power consumption of the display panel 101. In the following description, a reflective liquid crystal element is used as the reflective element 107.

As the light-emitting element 108, it is possible to use a self-luminous light-emitting element such as an organic electroluminescent (EL) element, an inorganic EL element, a light-emitting diode (LED), a quantum-dot light-emitting diode (QLED), or a semiconductor laser. In the following description, an organic EL element is used as the light-emitting element 108.

As the sensor 116, a variety of sensors can be used as needed. The sensor 116 can be a device capable of sensing force, position, speed, acceleration, angular velocity, rotational frequency, distance, light, liquid, magnetism, temperature, chemical substance, sound, hardness, current, voltage, electric power, radiation, flow rate, humidity, gradient, or oscillation, for example. Information (analog data) obtained by the sensor 116 is converted into digital data by the analog circuit 130.

When the sensor 116 is an optical sensor, for example, the display device 100 can change a display mode of the display panel 101 in response to light received by the sensor 116.

When sufficient luminance is obtained only with the reflective element 107, e.g., when the display device 100 is used outside on a sunny day, it is not necessary to make the light-emitting element 108 emit light. This is because favorable display is not obtained by using the light-emitting element 108 owing to strong external light. In contrast, when the display device 100 is used at night or in a dark place, display is performed by making the light-emitting element 108 emit light.

In response to the brightness of external light, the AP 110 can generate image data with which display is performed only by the reflective element 107, image data with which display is performed only by the light-emitting element 108, or image data with which display is performed by a combination of the reflective element 107 and the light-emitting element 108. Consequently, the display panel 101 can perform favorable display both in an environment with bright external light and in an environment with weak external light. Moreover, power consumption can be reduced by making the light-emitting element 108 emit no light or reducing the luminance of the light-emitting element 108 in an environment with bright external light.

The AP 110 can correct color tones of the display panel 101 by combining the display by the light-emitting element 108 with the display by the reflective element 107. For example, when the display device 100 is used in a reddish environment at nightfall, a blue (B) component is not sufficient only with the display by the reflective element 107; thus, the color tones can be corrected by making the light-emitting element 108 emit light.

The memory 142 is any rewritable memory such as dynamic oxide semiconductor RAM (DOSRAM, registered trademark), nonvolatile oxide semiconductor RAM (NOSRAM, registered trademark), SRAM, flash memory, ferroelectric RAM (FeRAM), magnetoresistive RAM (MRAM), resistive RAM (ReRAM), or phase-change RAM (PRAM). In particular, DORSRAM or NOSRAM is preferably used. The use of DORSRAM or NOSRAM as the memory 142 can reduce power consumption of the AP 110. Note that DORSRAM and NOSRAM will be described later.

The power control circuit 144 has a function of controlling power supply in the display device 100.

Because of including the FPGA 145, the AP 110 can flexibly deal with a case where a new function needs to be added after chip shipment. There is no need to design a chip newly; hence, the cost can be drastically reduced.

The clock generator circuit 146 has a function of generating a clock signal used in the display device 100. The clock generator circuit 146 can change the frequency of the clock signal and thus can achieve high performance and low power consumption of the display device 100. The clock generator circuit 146 increases the clock frequency when faster processing is needed. Meanwhile, the clock generator circuit 146 can decrease the clock frequency in order to reduce power consumption of the display device 100.

The semiconductor device described in Embodiment 1 is preferably used in the display_IFs 122 and 123, for example. When an image on the display panel 101 is not updated, for instance, power of the display_IFs 122 and 123 can be stopped to reduce power consumption of the AP 110.

<DOSRAM>

Next, a DOSRAM will be described in detail with reference to FIGS. 15A and 15B.

Figures 15A, 15B:
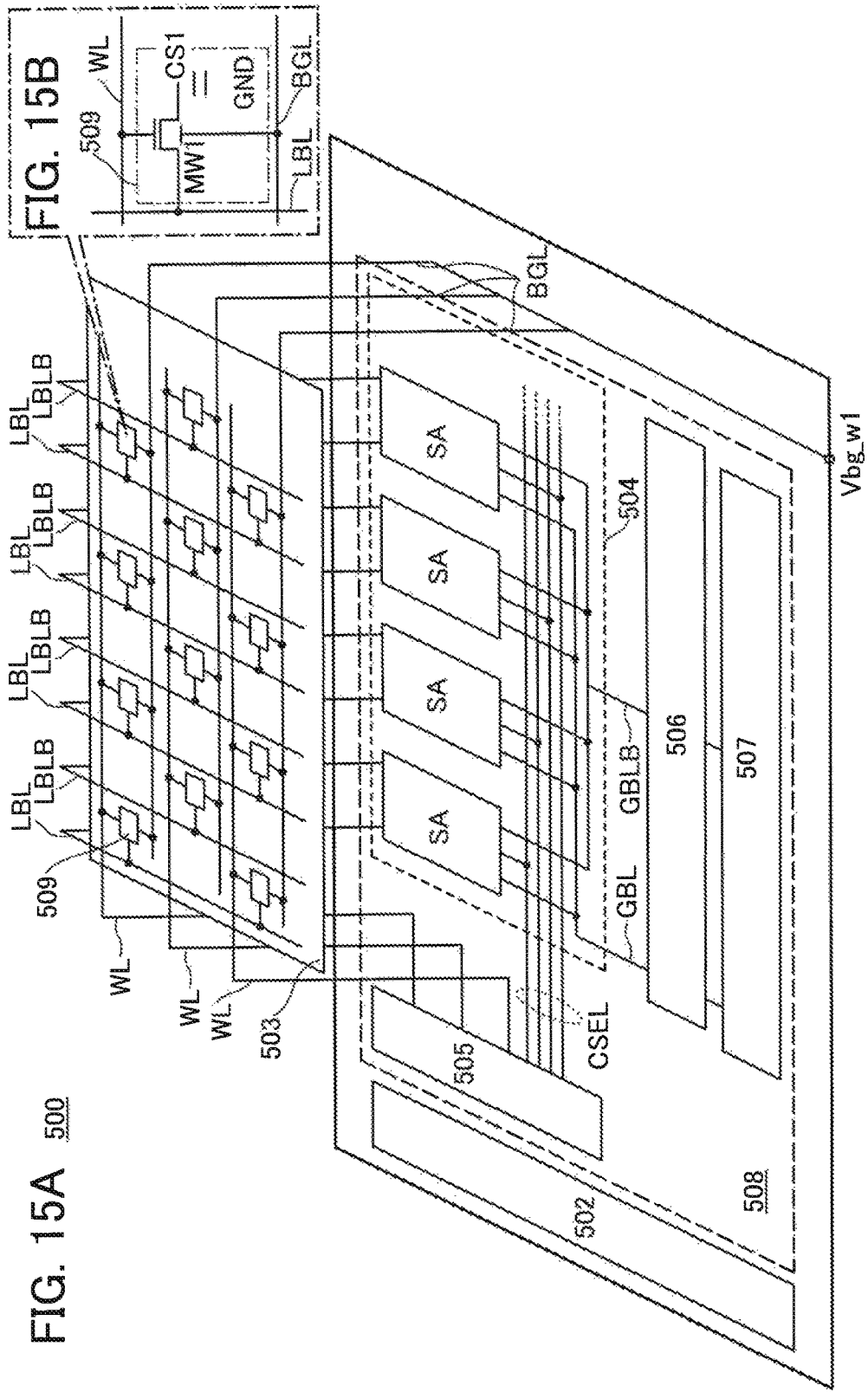
FIGS. 15A and 15B are a block diagram and a circuit diagram illustrating a configuration example of a DOSRAM.

FIG. 15A illustrates a configuration example of a DOSRAM 500. The DOSRAM 500 includes a control portion 502, a cell array 503, and a peripheral circuit 508. The peripheral circuit 508 includes a sense amplifier circuit 504, a driver 505, a main amplifier 506, and an input/output circuit 507.

The control portion 502 has a function of controlling the DOSRAM 500. For example, the control portion 502 controls the driver 505, the main amplifier 506, and the input/output circuit 507.

The driver 505 is electrically connected to a plurality of wirings WL and CSEL. The driver 505 generates signals output to the plurality of wirings WL and CSEL.

The cell array 503 includes a plurality of memory cells 509. The memory cells 509 are electrically connected to wirings WL, LBL (or LBLB), and BGL. The wiring WL is a word line. The wirings LBL and LBLB are local bit lines. Although the cell array 503 has a folded bit line architecture in the example of FIG. 15A, it can alternatively employ an open bit line architecture.

FIG. 15B illustrates a configuration example of the memory cell 509. The memory cell 509 includes a transistor M0 and a capacitor CS1. The memory cell 509 has a circuit configuration similar to that of a memory cell for DRAM. The transistor M0 is a transistor having a back gate. The back gate of the transistor M0 is electrically connected to the wiring BGL. A voltage Vbg_w1 is input to the wiring BGL.

The transistor M0 is an OS transistor. The off-state current of an OS transistor is extremely low. Forming the memory cell 509 using an OS transistor can suppress leakage of charge from the capacitor CS1, resulting in less frequent refresh operation of the DOSRAM 500. The DOSRAM 500 can retain image data for a long time even when power supply is stopped. Moreover, by setting the voltage Vbg_w1 to a negative voltage, the threshold voltage of the transistor M0 can be shifted to the positive side and thus the retention time of the memory cell 509 can be increased.

Transistors in the circuits other than the memory cells 509 can be, for example, Si transistors formed using a silicon wafer. Consequently, the cell array 503 can be stacked over the sense amplifier circuit 504. Thus, the circuit area of the DOSRAM 500 can be reduced, leading to a reduction in size of the AP 110.

The cell array 503 is stacked over the sense amplifier circuit 504. The sense amplifier circuit 504 includes a plurality of sense amplifiers SA. The sense amplifiers SA are electrically connected to adjacent wirings LBL and LBLB (a pair of local bit lines), wirings GBL and GBLB (a pair of global bit lines), and the plurality of wirings CSEL. The sense amplifier SA has a function of amplifying the potential difference between the wirings LBL and LBLB.

In the sense amplifier circuit 504, one wiring GBL is provided for four wirings LBL, and one wiring GBLB is provided for four wirings LBLB. However, the configuration of the sense amplifier circuit 504 is not limited to the configuration example of FIG. 15A.

The main amplifier 506 is connected to the sense amplifier circuit 504 and the input/output circuit 507. The main amplifier 506 has a function of amplifying the potential difference between the wirings GBL and GBLB. The main amplifier 506 is not necessarily provided.

The input/output circuit 507 has a function of outputting a potential corresponding to write data to the wirings GBL and GBLB or the main amplifier 506, and a function of reading potentials of the wirings GBL and GBLB or an output potential of the main amplifier 506 and outputting the potential(s) to the outside as data. The sense amplifier SA from which data is read and the sense amplifier SA to which data is written can be selected in accordance with a signal of the wiring CSEL. Consequently, there is no need to provide a selector circuit such as a multiplexer in the input/output circuit 507. Thus, the input/output circuit 507 can have a simple circuit configuration and a small occupied area.

<NOSRAM>

Next, a NOSRAM will be described in detail with reference to FIGS. 16A and 16B.

Figure 16A:
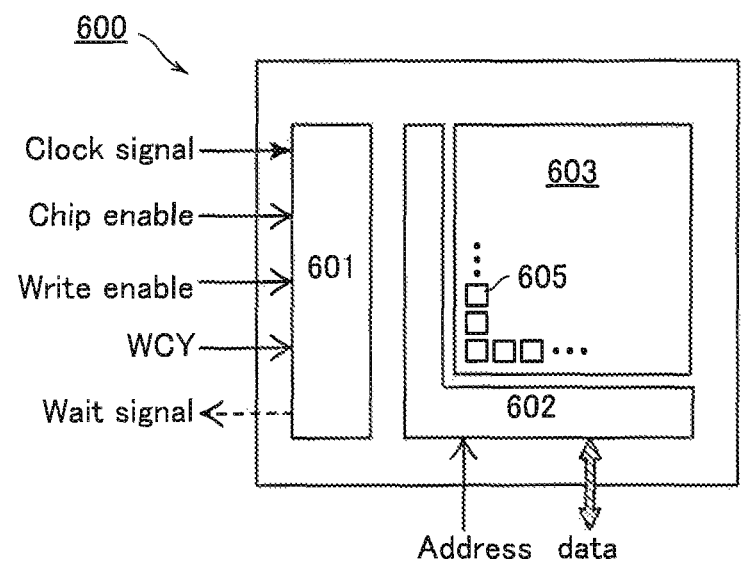
FIGS. 16A and 16B are a block diagram and a circuit diagram illustrating a configuration example of a NOSRAM.
Figure 16B:
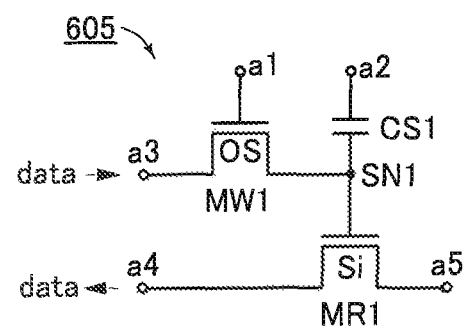

FIG. 16A is a block diagram illustrating a configuration example of a NOSRAM 600. The NOSRAM 600 shown in FIG. 16A includes a control portion 601, a driver portion 602, and a cell array 603.

The control portion 601 is a logic circuit having a function of controlling the entire operation of the NOSRAM 600. The control portion 601 has a function of performing logic operation of a chip enable signal and a write enable signal and determining whether access of the processor core 141 is write access or read access; a function of performing logic operation of a chip enable signal, a write enable signal, and a signal WCY and generating a control signal for the driver portion 602; and a function of issuing a wait signal on the basis of a write enable signal and the signal WCY.

With write access from the processor core 141, the control portion 601 issues a wait signal and sends it to the system bus 140. When the processor core 141 receives the wait signal, it delays execution of the next access.

A write enable signal is generated by the processor core 141. A chip enable signal is generated by the system bus 140. The system bus 140 generates a chip enable signal on the basis of an address signal and a write enable signal that are output from the processor core 141.

The driver portion 602 is a circuit for writing and reading data to/from the cell array 603. The driver portion 602 includes a decoder for decoding an address signal, a word line driver, a read circuit, and a write circuit, for example.

In the cell array 603, a plurality of memory cells 605 are arranged in a matrix. FIG. 16B illustrates a configuration example of the memory cell 605. Here, the memory cell 605 is a 2T gain cell. The memory cell 605 includes the transistor MW1, a transistor MR1, a capacitor CS1, a node SN1, and nodes a1 to a5. The transistor MW1 is an OS transistor serving as a write transistor. The transistor MR1 serves as a read transistor and is an n-channel Si transistor in the example of FIG. 16B. The node SN1 is a data retention node, and the capacitor CS1 is a storage capacitor for retaining charge of the node SN1.

To write data to the memory cell 605, data is input to the node a3. The node a1 is set to "H" to turn on the transistor MW1; thus, the data of the node a3 is written to the node SN1. The transistor MW1 is turned off to set the node SN1 in a floating state, whereby data writing is completed.

The voltage of the node a4 is read out as data. Data is read out in the following manner, for example. The potential of the node a5 is fixed. The node a4 is precharged and then set in a floating state. A drain current corresponding to the voltage of the node SN1 flows through the transistor MR1. Therefore, the voltage of the node a4 changes depending on the voltage of the node SN1.

The extremely low off-state current of the OS transistor can prevent a reduction in voltage of the node SN1 and enables data retention with no power consumption; thus, the memory cell 605 is nonvolatile (i.e., capable of retaining data for a long time). In view of this, OS memory with a cell array composed of gain cells is called NOSRAM in this specification and the like. NOSRAM has the following features in addition to long-term data retention.

Data is rewritten by charging and discharging of the capacitor; therefore, there is theoretically no limitation on rewrite cycles of NOSRAM, and data can be written to and read from NOSRAM with low energy. Owing to a simple circuit configuration of memory cells, the capacity of NOSRAM can be easily increased.

<Display Panel 101>

Next, the display panel 101 will be described in detail.

Figure 17:
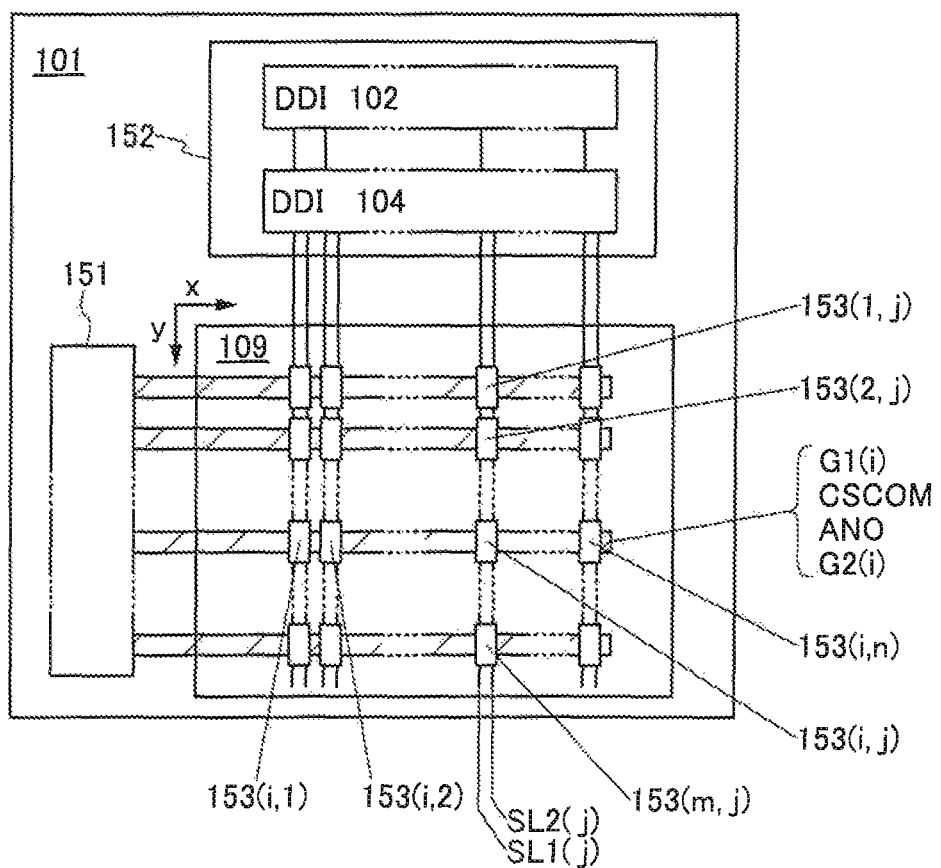
FIG. 17 is a block diagram illustrating a configuration example of a display panel.

FIG. 17 is a block diagram illustrating a configuration example of the display panel 101.

The display panel 101 includes a pixel array 109 and can also include a DDI 152 and a gate driver 151.

The pixel array 109 includes one group of pixels 153($i$,1) to 153($i$,$n$), another group of pixels 153(1,$j$) to 153($m$,$j$), a scan line G1($i$), a scan line G2($i$), a wiring CSCOM, a wiring ANO, a signal line SL1($j$), and a signal line SL2($j$). Note that each of m and n is an integer of 1 or more, i is an integer of 1 to m, and j is an integer of 1 to n.

The group of pixels 153($i$,1) to 153($i$,$n$) include the pixel 153($i$,$j$) and are provided in the row direction (the direction indicated by the arrow x in FIG. 17).

The group of pixels 153(1,$j$) to 153($m$,$j$) include the pixel 153($i$,$j$) and are provided in the column direction (the direction indicated by the arrow y in FIG. 17) that intersects the row direction.

The scan line G1($i$) and the scan line G2($i$) are electrically connected to the group of pixels 153($i$,1) to 153($i$,$n$) arranged in the row direction.

The group of the pixels 153(1,$j$) to 153($m$,$j$) arranged in the column direction are electrically connected to the signal line SL1($j$) and the signal line SL2($j$).

The gate driver 151 has a function of supplying a selection signal on the basis of control information.

For example, the gate driver 151 has a function of supplying a selection signal to one scan line at a frequency of 30 Hz or higher, preferably 60 Hz or higher, on the basis of control information. Accordingly, moving images can be smoothly displayed.

For example, the gate driver 151 has a function of supplying a selection signal to one scan line at a frequency of lower than 30 Hz, preferably lower than 1 Hz, more preferably less than once per minute, on the basis of control information. Accordingly, a still image can be displayed while flickering is suppressed.

The DDI 152 includes the DDI 102 and the DDI 104. The DDI 152 functions as a source driver of the display panel 101. Specifically, the DDI 152 has a function of supplying a data signal on the basis of a signal from the AP 110.

For example, the DDI 152 can be configured with an integrated circuit formed on a silicon substrate. The integrated circuit can be mounted on a terminal, for example, by a chip on glass (COG) method or a chip on film (COF) method, specifically by using an anisotropic conductive film.

<Pixel 153>

Figure 18:
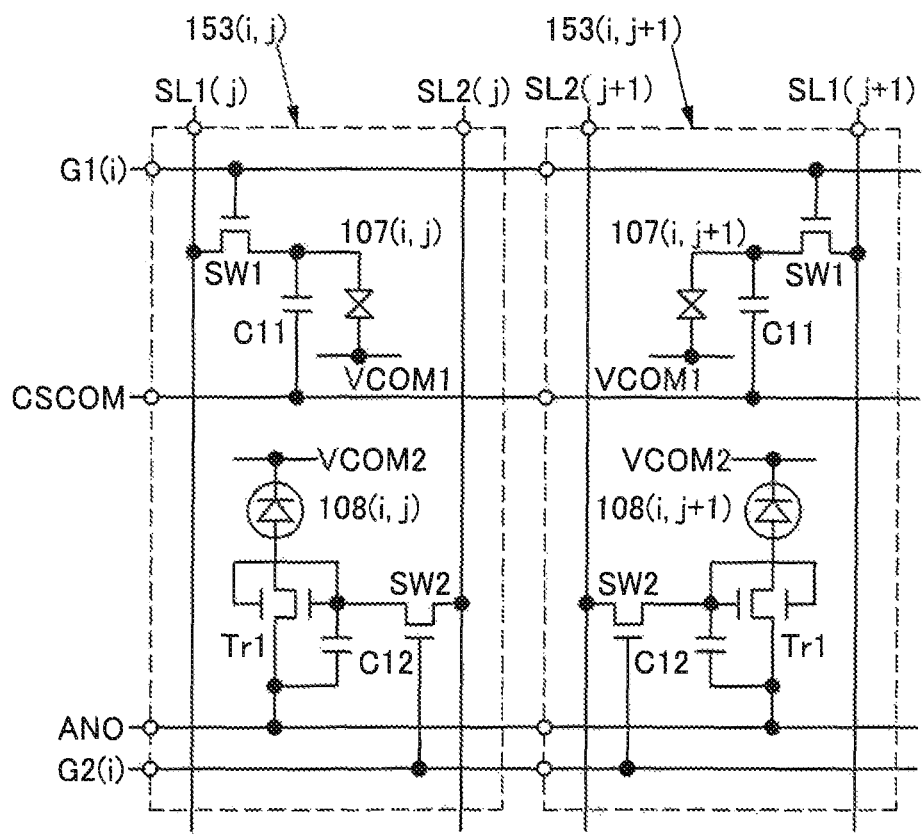
FIG. 18 is a circuit diagram illustrating a configuration example of pixels.

FIG. 18 is a circuit diagram illustrating a configuration example of the pixel 153. The pixel 153($i$,$j$) has a function of driving a reflective element 107($i$,$j$) and alight-emitting element 108($i$,$j$). Accordingly, the reflective element 107 and the light-emitting element 108, which performs display by a method different from that for the reflective element 107, can be driven with one pixel circuit, for example. With the use of the reflective element 107, display can be performed with lower power consumption, or images with high contrast can be favorably displayed in an environment with bright external light. With the use of the light-emitting element 108, images can be favorably displayed in a dark environment.

The pixel 153($i$,$j$) is electrically connected to the signal line SL1($j$), the signal line SL2($j$), the scan line G1($i$), the scan line G2($i$), the wiring CSCOM, and the wiring ANO.

The pixel 153($i$,$j$) includes a switch SW1, a capacitor C11, a switch SW2, a transistor Tr1, and a capacitor C12.

For example, a transistor having a gate electrode electrically connected to the scan line G1($i$) and a first electrode electrically connected to the signal line SL1($j$) can be used as the switch SW1.

The capacitor C11 has a first electrode electrically connected to a second electrode of the transistor used as the switch SW1 and a second electrode electrically connected to the wiring CSCOM.

A transistor having a gate electrode electrically connected to the scan line G2(i) and a first electrode electrically connected to the signal line SL2(j) can be used as the switch SW2.

The transistor Tr1 has a gate electrode electrically connected to a second electrode of the transistor used as the switch SW2 and a first electrode electrically connected to the wiring ANO.

Note that the transistor Tr1 may have a first gate electrode and a second gate electrode. The first gate electrode and the second gate electrode may be electrically connected to each other. The first gate electrode and the second gate electrode preferably have regions overlapping each other with a semiconductor film positioned therebetween.

The capacitor C12 has a first electrode electrically connected to the second electrode of the transistor used as the switch SW2 and a second electrode electrically connected to the first electrode of the transistor Tr1.

A first electrode of the reflective element 107(i,j) is electrically connected to the second electrode of the transistor used as the switch SW1. A second electrode of the reflective element 107(i,j) is electrically connected to a wiring VCOM1. Accordingly, the reflective element 107(i,j) can be driven.

A first electrode of the light-emitting element 108(i,j) is electrically connected to the second electrode of the transistor Tr1. A second electrode of the light-emitting element 108(i,j) is electrically connected to a wiring VCOM2. Accordingly, the light-emitting element 108(i,j) can be driven.

<Cross-Sectional View of Display>

Next, a structure example of the display panel 101 will be described with reference to a cross-sectional view in FIG. 19.

Figure 19:
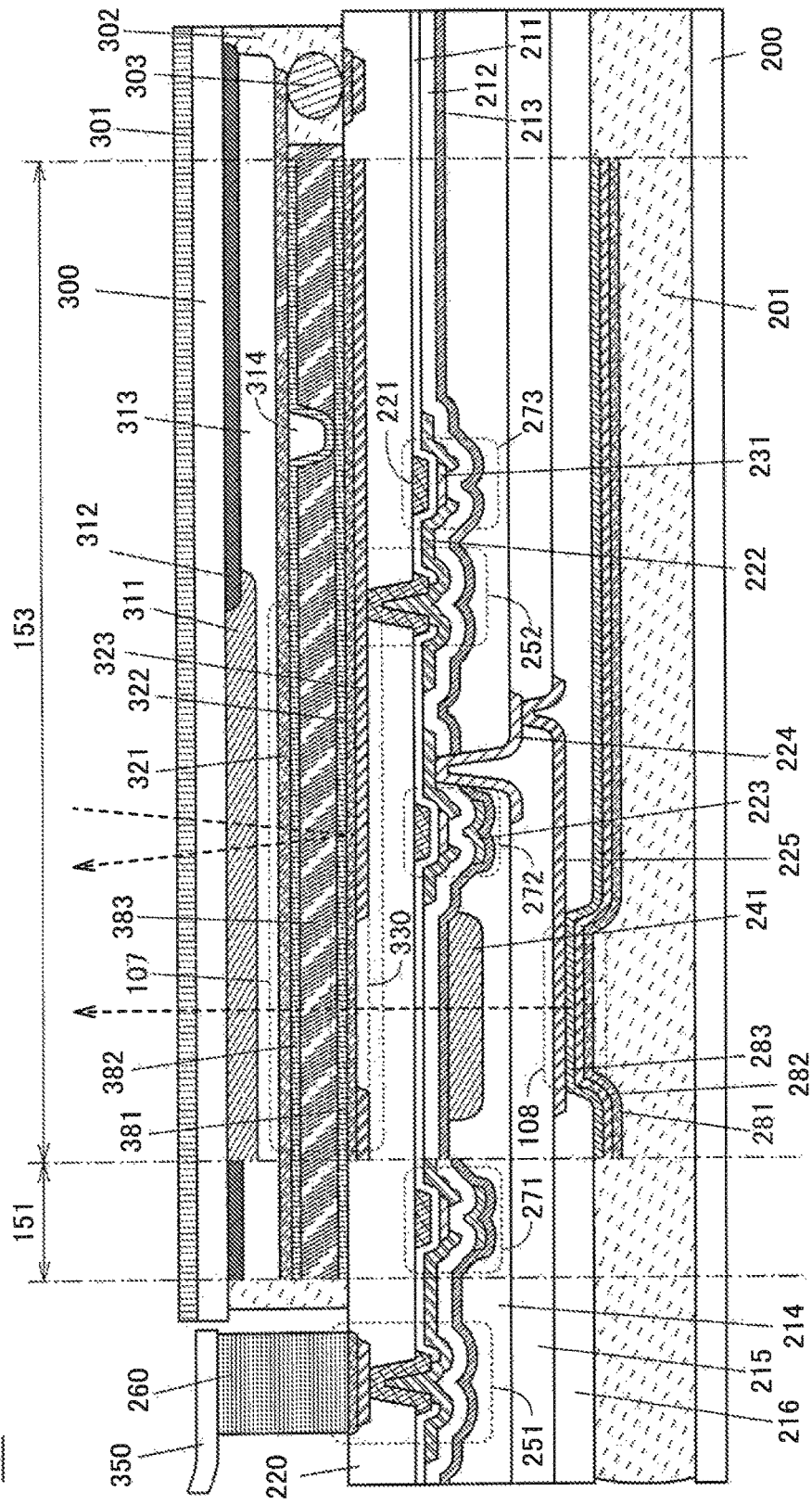
FIG. 19 is a cross-sectional view illustrating a structure example of a display panel.

The display panel 101 illustrated in FIG. 19 includes an insulating layer 220 between a substrate 200 and a substrate 300. The display panel 101 includes the light-emitting element 108, a transistor 271, a transistor 272, a transistor 273, a coloring layer 241, and the like between the substrate 200 and the insulating layer 220. Furthermore, the display panel 101 includes the reflective element 107, a coloring layer 311, and the like between the insulating layer 220 and the substrate 300. The substrate 300 and the insulating layer 220 are bonded with an adhesive layer 302. The substrate 200 and the insulating layer 220 are bonded with an adhesive layer 201.

For the substrate 200, non-alkali glass, soda-lime glass, potash glass, lead glass, aluminosilicate glass, tempered glass, chemically tempered glass, quartz glass, sapphire glass, or the like can be used.

As the substrate 200, a single crystal semiconductor substrate or a polycrystalline semiconductor substrate of silicon or silicon carbide, a compound semiconductor substrate of silicon germanium or the like, or an SOI substrate can be used.

For the substrate 200, a composite material formed by attaching a metal plate, a thin glass plate, or a film of an inorganic material or the like to a resin film or the like can be used.

For the substrate 200, a composite material formed by dispersing a fibrous or particulate metal, glass, an inorganic material, or the like into a resin film can be used.

For the substrate 200, a composite material formed by dispersing a fibrous or particulate resin, an organic material, or the like into an inorganic material can be used, for example.

For the substrate 300, any of the above materials applicable to the substrate 200 can be used.

Note that the substrate 200 or the substrate 300 may be provided with electrodes to have a touch panel function.

The transistor 273 is electrically connected to the reflective element 107. The transistor 272 is electrically connected to the light-emitting element 108. The transistors 272 and 273 are formed on a surface on the substrate 200 side of the insulating layer 220, so that these transistors can be formed through the same process.

The substrate 300 is provided with the coloring layer 311, a light-blocking layer 312, an insulating layer 313, a conductive layer 321 functioning as a common electrode of the reflective element 107, an alignment film 382, an insulating layer 314, and the like. The insulating layer 314 has a function of holding a cell gap of the reflective element 107.

Insulating layers such as an insulating layer 211, an insulating layer 212, an insulating layer 213, an insulating layer 214, and an insulating layer 215 are provided on the substrate 200 side of the insulating layer 220. Part of the insulating layer 211 functions as a gate insulating layer of each transistor. The insulating layers 212, 213, and 214 are provided to cover each transistor. The insulating layer 215 is provided to cover the insulating layer 214. The insulating layers 214 and 215 each function as a planarization layer. Note that here, the three insulating layers 212, 213, and 214 are provided to cover the transistors and the like; however, one embodiment of the present invention is not limited to this example, and four or more insulating layers, a single insulating layer, or two insulating layers may be provided. The insulating layer 214 functioning as a planarization layer is not necessarily provided when not needed.

The transistor 271, the transistor 272, and the transistor 273 each include a conductive layer 221 part of which functions as a gate, conductive layers 222 part of which functions as a source and a drain, and a semiconductor layer 231. Here, a plurality of layers obtained by processing one conductive film are shown with the same hatching pattern.

The reflective element 107 is a reflective liquid crystal element. The reflective element 107 has a stacked structure of a conductive layer 322, liquid crystal 383, and the conductive layer 321. A conductive layer 323 that reflects visible light is provided in contact with the conductive layer 322 on the substrate 200 side. The conductive layer 323 has an opening 330. The conductive layers 321 and 322 transmit visible light. An alignment film 381 is provided between the liquid crystal 383 and the conductive layer 322, and the alignment film 382 is provided between the liquid crystal 383 and the conductive layer 321. A polarizing plate 301 is provided on an outer surface of the substrate 300.

In the reflective element 107, the conductive layer 323 has a function of reflecting visible light, and the conductive layer 321 has a function of transmitting visible light. Light entering from the substrate 300 side is polarized by the polarizing plate 301, passes through the conductive layer 321 and the liquid crystal 383, and is reflected by the conductive layer 323. Then, the light passes through the liquid crystal 383 and the conductive layer 321 again and reaches the polarizing plate 301. At this time, alignment of the liquid crystal is controlled with a voltage that is applied between the conductive layer 323 and the conductive layer 321, and thus optical modulation of light can be controlled. That is, the intensity of light emitted through the polarizing plate 301 can be controlled. Light excluding light in a particular wavelength region is absorbed by the coloring layer 311, and thus, emitted light is red light, for example.

The light-emitting element 108 is a bottom-emission light-emitting element. The light-emitting element 108 has a structure in which a conductive layer 225, a conductive layer 283, and a conductive layer 282 are stacked in this order from the insulating layer 220 side. The insulating layer 216 covers an end portion of the conductive layer 225. A conductive layer 281 is provided to cover the conductive layer 282. The conductive layer 281 contains a material reflecting visible light, and the conductive layers 225 and 282 contain a material transmitting visible light. Light is emitted from the light-emitting element 108 to the substrate 300 side through the coloring layer 241, the insulating layer 220, the opening 330, the conductive layer 321, and the like.

Here, as illustrated in FIG. 19, the conductive layer 322 transmitting visible light is preferably provided in the opening 330. Accordingly, the liquid crystal 383 in a region overlapping the opening 330 is aligned in a similar manner as in the other regions, preventing undesired light leakage caused by an alignment defect of the liquid crystal in the boundary portion of the region overlapping the opening 330 and the other regions.

As the polarizing plate 301 provided on the outer surface of the substrate 300, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, driving voltage, and the like of the liquid crystal element used as the reflective element 107 are controlled in accordance with the type of the polarizing plate so that desirable contrast is obtained.

One of the source and the drain of the transistor 272 is electrically connected to the conductive layer 225 of the light-emitting element 108 through a conductive layer 224.

One of the source and the drain of the transistor 273 is electrically connected to the conductive layer 323 through a connection portion 252. The conductive layers 322 and 323 are in contact with and electrically connected to each other. In the connection portion 252, the conductive layers provided on both surfaces of the insulating layer 220 are connected to each other through an opening in the insulating layer 220.

A connection portion 251 is provided in a region where the substrate 200 and the substrate 300 do not overlap. The connection portion 251 is electrically connected to an FPC 350 through a connection layer 260. A conductive layer obtained by processing the same conductive film as the conductive layer 322 is exposed at atop surface of the connection portion 251. Thus, the connection portion 251 can be electrically connected to the FPC 350 through the connection layer 260.

A connector 303 is provided in part of a region where the adhesive layer 302 is provided. A conductive layer obtained by processing the same conductive film as the conductive layer 322 is electrically connected to part of the conductive layer 321 through the connector 303. Accordingly, a signal or a potential input from the FPC 350 connected to the substrate 200 side can be supplied to the conductive layer 321 formed on the substrate 300 side through the connector 303.

As the connector 303, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. For the connector 303, a material capable of elastic deformation or plastic deformation is preferably used. The connector 303, which is the conductive particle, sometimes has a shape that is squeezed vertically as illustrated in FIG. 19. With the connector 303 having the squeezed shape, the contact area between the connector 303 and a conductive layer electrically connected to the connector 303 can be increased, thereby reducing contact resistance and suppressing defects such as disconnection.

The connector 303 is preferably provided to be covered with the adhesive layer 302. For example, the connector 303 is dispersed in the adhesive layer 302 before the adhesive layer 302 is cured.

FIG. 19 illustrates an example where the gate driver 151 includes the transistor 271.

In FIG. 19, the transistors 271 and 272 employ a structure in which the semiconductor layer 231 where a channel is formed is provided between two gates. One of the gates is formed of the conductive layer 221, and the other gate is formed of a conductive layer 223 that overlaps with the semiconductor layer 231 with the insulating layer 212 placed therebetween. Such a structure enables control of the threshold voltage of the transistor. In that case, the two gates may be connected to each other and supplied with the same signal so that the transistor operate. Such a transistor can have higher field-effect mobility and thus have higher on-state current than other transistors. As a result, a circuit capable of high-speed operation is obtained. Moreover, the area occupied by a circuit portion can be reduced. The use of the transistor having high on-state current can reduce signal delay in wirings and can reduce display unevenness even in a display panel in which the number of wirings is increased because of the increase in size or resolution.

The transistors 271, 272, and 273 are preferably OS transistors; therefore, the semiconductor layer 231 is preferably formed using an oxide semiconductor or a metal oxide.

Note that the transistors included in the gate driver 151 and the transistors included in the pixel 153 may have the same structure. A plurality of transistors included in the gate driver 151 may have the same structure or different structures. A plurality of transistors included in the pixel 153 may have the same structure or different structures.

A material through which impurities such as water or hydrogen do not easily diffuse is preferably used for at least one of the insulating layers 212 and 213 that cover the transistors. That is, the insulating layer 212 or the insulating layer 213 can function as a barrier film. Such a structure can effectively suppress diffusion of impurities into the transistors from the outside, and a highly reliable display panel can be provided.

The insulating layer 313 is provided on the substrate 300 side to cover the coloring layer 311 and the light-blocking layer 312. The insulating layer 313 may have a function of a planarization layer. The insulating layer 313 enables the conductive layer 321 to have an almost flat surface, resulting in a uniform alignment state of the liquid crystal 383.

An example of a method for manufacturing the display panel 101 will be described. For example, the conductive layer 322, the conductive layer 323, and the insulating layer 220 are formed in this order over a supporting substrate provided with a separation layer, and then the transistor 272, the transistor 273, the light-emitting element 108, and the like are formed. Subsequently, the substrate 200 and the supporting substrate are bonded with the adhesive layer 201. After that, separation is performed at the interface between the separation layer and each of the insulating layer 220 and the conductive layer 322, whereby the support substrate and the separation layer are removed. Separately, the substrate 300 provided with the coloring layer 311, the light-blocking layer 312, the conductive layer 321, and the like is prepared. Then, the liquid crystal 383 is dropped onto the substrate 200 or the substrate 300, and the substrate 200 and the substrate 300 are bonded with the adhesive layer 302, whereby the display panel 101 can be manufactured.

A material for the separation layer can be selected such that separation at the interface with the insulating layer 220 and the conductive layer 322 occurs. Preferably, the separation layer is a stack of a layer containing a high-melting-point metal material (e.g., tungsten) and a layer containing an oxide of the metal material, and the insulating layer 220 over the separation layer is a stack of a plurality of layers, such as a silicon nitride layer, a silicon oxynitride layer, and a silicon nitride oxide layer. The use of the high-melting-point metal material for the separation layer can increase the formation temperature of layers formed in later steps, which reduces impurity concentration and achieves a highly reliable display device.

For the conductive layer 322, an oxide or a nitride such as a metal oxide, a metal nitride, or an oxide semiconductor whose resistance is reduced is preferably used. In the case of using an oxide semiconductor, the conductive layer 322 is formed using a material in which at least one of the concentrations of hydrogen, boron, phosphorus, nitrogen, and other impurities and the amount of oxygen vacancies is made to be higher than that in a semiconductor layer of a transistor.

<Usage Examples of Display Device 100>

Next, usage examples of the display device 100 will be described with reference to FIG. 20 and FIGS. 21A and 21B.

Figure 20:
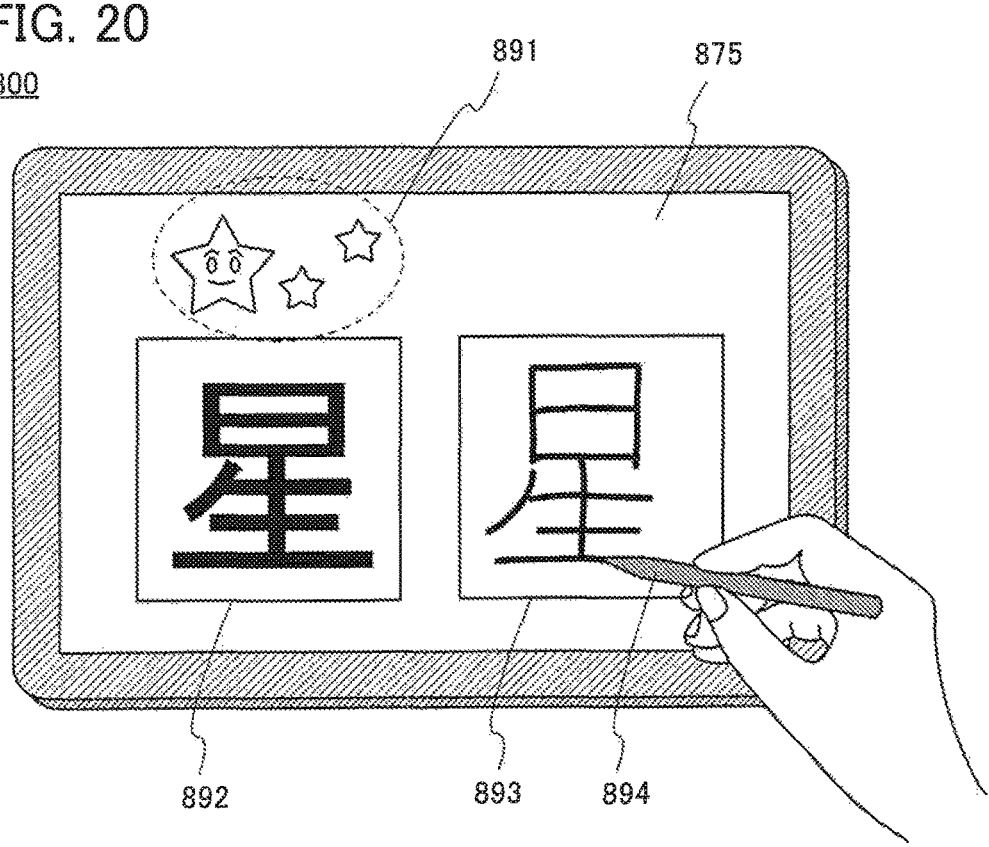
FIG. 20 illustrates a usage example of an information terminal.

FIG. 20 illustrates a usage example of an information terminal 800 including the display device 100. FIG. 20 shows an example of learning letters with the information terminal 800.

An illustration 891, a frame 892, and a frame 893 are displayed on a display region 875 of the information terminal 800. A good example of a letter is displayed within the frame 892. A user writes the same letter as that displayed within the frame 892, in the frame 893 with a stylus 894. The information terminal 800 displays the illustration 891 that is related to the letter within the frame 892.

The information terminal 800 can be provided with a camera, a speaker, a microphone, an operation button, or the like if necessary.

Power consumption of the information terminal 800 including the display device 100 is low, which enables a battery to last for a long time.

Figure 21A:
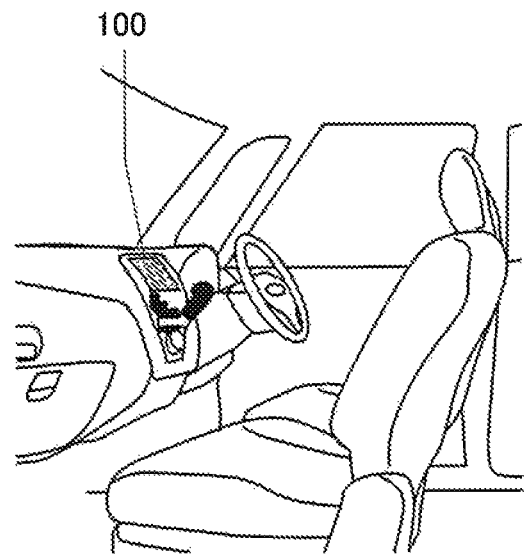
FIGS. 21A and 21B illustrate usage examples of a display device.
Figure 21B:
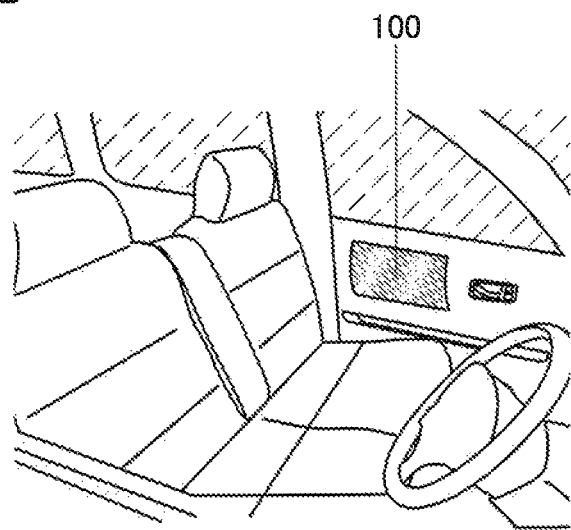

FIGS. 21A and 21B illustrate examples where the display device 100 is used inside a car.

FIG. 21A illustrates a front glass and its vicinity inside a car. FIG. 21A shows the display device 100 attached to a dashboard.

FIG. 21B illustrates the display device 100 provided on a door.

The display device 100 can provide various kinds of information of, for example, a navigation system, a speedometer, a tachometer, an odometer, a fuel gauge, a gear position indicator, and air-conditioning controls.

The display device 100 can provide the view of a blind spot from the driver's seat, for example, by displaying an image taken by a camera provided for the car body on a display portion.

When a display device is used in a car, its display portion is sometimes exposed to direct sunlight. In a display device having a display portion that emits light (e.g., a display device using a transmissive liquid crystal element or an organic EL element), exposure of the display portion to sunlight lowers the visibility.

When sensing sunlight, the display device 100 described in this embodiment can switch the display mode so that display is performed with the reflective element. Thus, the display device 100 can keep displaying images without lowering the visibility.

At night, the display device 100 described in this embodiment can switch the display mode so that display is performed with the light-emitting element. Accordingly, a driver can use the display device 100 even at night without external light.

The use of the display device 100 described in this embodiment makes it possible to provide a display device with low power consumption and a display device with high visibility.

Embodiment 3

<Composition of CAC-OS>

Described below is the composition of a CAC-OS applicable to an OS transistor disclosed in one embodiment of the present invention.

The CAC-OS has, for example, a composition of a material in which elements included in an oxide semiconductor are unevenly distributed in regions each having a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions that include the metal element(s) and have a size of 0.5 nm to 10 nm, preferably 1 nm to 2 nm, or a similar size are mixed is referred to as a mosaic pattern or a patch-like pattern.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are each a real number greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are each a real number greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is higher than the atomic ratio of In to the element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$, where m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that the CAC-OS does not include a stacked-layer structure including two or more films with different atomic ratios, e.g., a two-layer structure of a film including In as a main component and a film including Ga as a main component.

A boundary between the region including $GaO_{X3}$ as a main component and the region including $In_{X2}Zn_{Y2}O_{Z2}$ or $InO_{X1}$ as a main component is not clearly observed in some cases.

When one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas can be used as a deposition gas. The percentage of the flow rate of an oxygen gas in the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS obtained by irradiation with an electron beam having a probe diameter of 1 nm (also referred to as nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in the plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including the CAC-OS has high reliability; thus, the CAC-OS is suitably used in a variety of semiconductor devices typified by displays.

Unless otherwise specified, an on-state current in this specification refers to a drain current of a transistor in an on state. Unless otherwise specified, the on state (also sometimes abbreviated to "on") of an n-channel transistor means that the voltage ($V_G$) between its gate and source is higher than or equal to the threshold voltage ($V_{th}$), and the on state of a p-channel transistor means that $V_G$ is lower than or equal to $V_{th}$. For example, the on-state current of an n-channel transistor sometimes refers to a drain current that flows when $V_G$ is higher than or equal to $V_{th}$. The on-state current of a transistor sometimes depends on a voltage ($V_D$) between a drain and a source.

Unless otherwise specified, an off-state current in this specification refers to a drain current of a transistor in an off state. Unless otherwise specified, the off state (also sometimes abbreviated to "off") of an n-channel transistor means that $V_G$ is lower than $V_{th}$, and the off state of a p-channel transistor means that $V_G$ is higher than $V_{th}$. For example, the off-state current of an n-channel transistor sometimes refers to a drain current that flows when $V_G$ is lower than $V_{th}$. The off-state current of a transistor depends on $V_G$ in some cases. Thus, "the off-state current of a transistor is lower than $10^{-21}$ A" may mean there is $V_G$ at which the off-state current of the transistor is lower than $10^{-21}$ A.

The off-state current of a transistor depends on $V_D$ in some cases. Unless otherwise specified, the off-state current in this specification may be an off-state current at $V_D$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current of a transistor may be an off-state current at $V_D$ used in a semiconductor device or the like including the transistor.

In this specification and the like, the terms "one of a source and a drain" (or first electrode or first terminal) and "the other of the source and the drain" (or second electrode or second terminal) are used to describe the connection relation of a transistor. This is because the source and the drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

For example, a description "X and Y are connected" in this specification and the like means that X and Y are electrically connected and X and Y are directly connected.

Here, X and Y each denote an object (e.g., a device, an element, a circuit, a wiring, an electrode, a terminal, a conductive film, or a layer).

For example, in the case where X and Y are directly connected, X and Y are connected without an element that allows electrical connection between X and Y (e.g., a switch, a transistor, a capacitor, an inductor, a resistor, a diode, a display element, a light-emitting element, or a load) provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that a switch is conducting or not conducting (is turned on or off) to determine whether current flows therethrough or not. Alternatively, a switch has a function of selecting and changing a current path. Note that the case where X and Y are electrically connected includes the case where X and Y are directly connected.

REFERENCE NUMERALS a1: node, a2: node, a3: node, a4: node, a5: node, A0: signal, A1: signal, B0: signal, B1: signal, C1: capacitor, C2: capacitor, C11: capacitor, C12: capacitor, CS1: capacitor, E0: signal, E1: signal, G1: scan line, G2: scan line, I1: inverter, I2: inverter, IN0: signal, IN1: signal, M0: transistor, M1: transistor, MR1: transistor, MW1: transistor, M2: transistor, M3: transistor, M4: transistor, M5: transistor, M6: transistor, M7: transistor, M8: transistor, M9: transistor, M10: transistor, M11: transistor, M12: transistor, N1: node, N2: node, OUT0: signal, OUT1: signal, S0: signal, S1: signal, SL1: signal line, SL2: signal line, SN1: node, SW1: switch, SW2: switch, T01: time, T1: time, T02: time, T2: time, T03: time, T3: time, T04: time, T4: time, T05: time, T5: time, T06: time, T6: time, T07: time, T7: time, T08: time, T8: time, T09: time, T10: time, Tr1: transistor, VCOM1: wiring, VCOM2: wiring, 10: semiconductor device, 11: latch circuit, 12: memory circuit, 13: semiconductor device, 20: semiconductor device, 20_A: semiconductor device, 20_B: semiconductor device, 20R: semiconductor device, 205: semiconductor device, 21: semiconductor device, 22: semiconductor device, 23: semiconductor device, 24: semiconductor device, 25: semiconductor device, 26: semiconductor device, 27: semiconductor device, 100: display device, 101: display panel, 102: DDI, 104: DDI, 106: touch panel, 107: reflective element, 108: light-emitting element, 109: pixel array, 110: AP, 111: DRAM, 112: flash memory, 113: SSD, 114: RF tag, 115: TV tuner, 116: sensor, 121: GPU, 122: display_IF, 123: display_IF, 124: touch panel_IF, 125: DRAM_IF, 126: flash memory_IF, 127: SSD_IF, 128: network_IF, 129: USB_IF, 130: analog circuit, 140: system bus, 141: processor core, 142: memory, 144: power control circuit, 145: FPGA, 146: clock generator circuit, 151: gate driver, 152: DDI, 153: pixel, 200: substrate, 201: adhesive layer 211: insulating layer, 212: insulating layer, 213: insulating layer, 214: insulating layer, 215: insulating layer, 216: insulating layer, 220: insulating layer, 221: conductive layer, 222: conductive layer, 223: conductive layer, 224: conductive layer, 225: conductive layer, 231: semiconductor layer, 241: coloring layer, 251: connection portion, 252: connection portion, 260: connection layer 271: transistor, 272: transistor, 273: transistor, 281: conductive layer, 282: conductive layer, 283: conductive layer, 300: substrate, 301: polarizing plate, 302: adhesive layer, 303: connector, 311: coloring layer, 312: light-blocking layer, 313: insulating layer, 314: insulating layer, 321: conductive layer, 322: conductive layer, 323: conductive layer, 330: opening, 350: FPC, 381: alignment film, 382: alignment film, 383: liquid crystal, 500: DOSRAM, 502: control portion, 503: cell array, 504: sense amplifier circuit, 505: driver, 506: main amplifier, 507: input/output circuit, 508: peripheral circuit, 509: memory cell, 600: NOSRAM, 601: control portion, 602: driver portion, 603: cell array, 605: memory cell, 800: information terminal, 875: display region, 891: illustration, 892: frame, 893: frame, 894: stylus This application is based on Japanese Patent Application Serial No. 2016-141337 filed with Japan Patent Office on Jul. 19, 2016, the entire contents of which are hereby incorporated by reference.

The invention claimed is:
1. A semiconductor device comprising:
a Muller C-element comprising:
a latch circuit; and
a first memory element comprising:
a first transistor comprising an oxide semiconductor in a channel formation region;
a second transistor; and
a first capacitor,
wherein one of a source and a drain of the first transistor is electrically connected to the first capacitor and a gate of the second transistor, and
wherein the other of the source and the drain of the first transistor and on of a source and a drain of the second transistor are electrically connected to the latch circuit.
2. The semiconductor device according to claim 1, wherein the Muller C-element has a plurality of input terminals.
3. The semiconductor device according to claim 1, wherein the Muller C-element has two or three input terminals.
4. The semiconductor device according to claim 1, wherein the Muller C-element further comprises a second memory element,
wherein the second memory element comprises:
a third transistor comprising an oxide semiconductor in a channel formation region;
a fourth transistor; and
a second capacitor,
wherein the latch circuit comprises:
a first inverter comprising a first input terminal and a first output terminal; and
a second inverter comprising a second input terminal and a second output terminal,
wherein the first input terminal is electrically connected to the second output terminal,
wherein the first output terminal is electrically connected to the second input terminal,
wherein the first output terminal is electrically connected to the first capacitor through the first transistor, and wherein the second output terminal is electrically connected to the second capacitor through the third transistor.

* * * * *